(12) United States Patent
Takai

(10) Patent No.: US 7,558,120 B2
(45) Date of Patent: Jul. 7, 2009

(54) SEMICONDUCTOR INTEGRATED CIRCUIT DEVICE COMPRISING MOS TRANSISTOR HAVING CHARGE STORAGE LAYER AND METHOD FOR TESTING SEMICONDUCTOR MEMORY DEVICE

(75) Inventor: Hideyoshi Takai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 19 days.

(21) Appl. No.: 11/961,172

(22) Filed: Dec. 20, 2007

(65) Prior Publication Data

US 2008/0151661 A1 Jun. 26, 2008

(30) Foreign Application Priority Data

Dec. 25, 2006 (JP) ............................ 2006-348004

(51) Int. Cl.
*G11C 16/06* (2006.01)
*G11C 16/04* (2006.01)
*G11C 29/00* (2006.01)

(52) U.S. Cl. ............................ 365/185.22; 365/185.18; 365/201

(58) Field of Classification Search ............. 365/185.22
See application file for complete search history.

(56) References Cited

U.S. PATENT DOCUMENTS 5,504,760 A * 4/1996 Harari et al. ................. 714/763
5,784,315 A 7/1998 Itoh
6,226,200 B1 * 5/2001 Eguchi et al. .......... 365/185.19
6,665,214 B1 12/2003 Cheah et al.
7,020,017 B2 * 3/2006 Chen et al. ............. 365/185.03
7,403,438 B2 * 7/2008 Zipprich-Rasch ........... 365/201
2003/0128590 A1 * 7/2003 Roohparvar ........... 365/185.22
2005/0249002 A1 11/2005 Auge et al.
2005/0286301 A1 * 12/2005 Mochizuki ............. 365/185.17

FOREIGN PATENT DOCUMENTS

JP 11-39226 2/1999

* cited by examiner

*Primary Examiner*—Son L Mai
(74) *Attorney, Agent, or Firm*—Oblon, Spivak, McClelland, Maier & Neustadt, P.C.

(57) ABSTRACT

A semiconductor integrated circuit device includes a semiconductor memory and a test circuit. The semiconductor memory includes a memory block having a plurality of memory cells and tests the memory cells. The test circuit includes a controller and a counter. The controller consecutively increments a gate voltage of the memory cells and controls the semiconductor memory so as to read a data from the memory cells provide with the gate voltage. The counter measures, for the gate voltage, the number of memory cells determined to be defective. The controller determines the memory block to be defective when the counter consecutively shows a count falling within a predetermined range during the variation in gate voltage.

15 Claims, 18 Drawing Sheets

| Verification start voltage |
|---|
| Vth1 |
| Vth2 |
| Vth3 |
| ⋮ |

F I G. 8

| Verification end voltage |
|---|
| Vth-end1 |
| Vth-end2 |
| Vth-end3 |
| ⋮ |

F I G. 9

| Step voltage |
|---|
| ΔVth1 |
| ΔVth2 |
| ΔVth3 |
| ⋮ |

F I G. 10

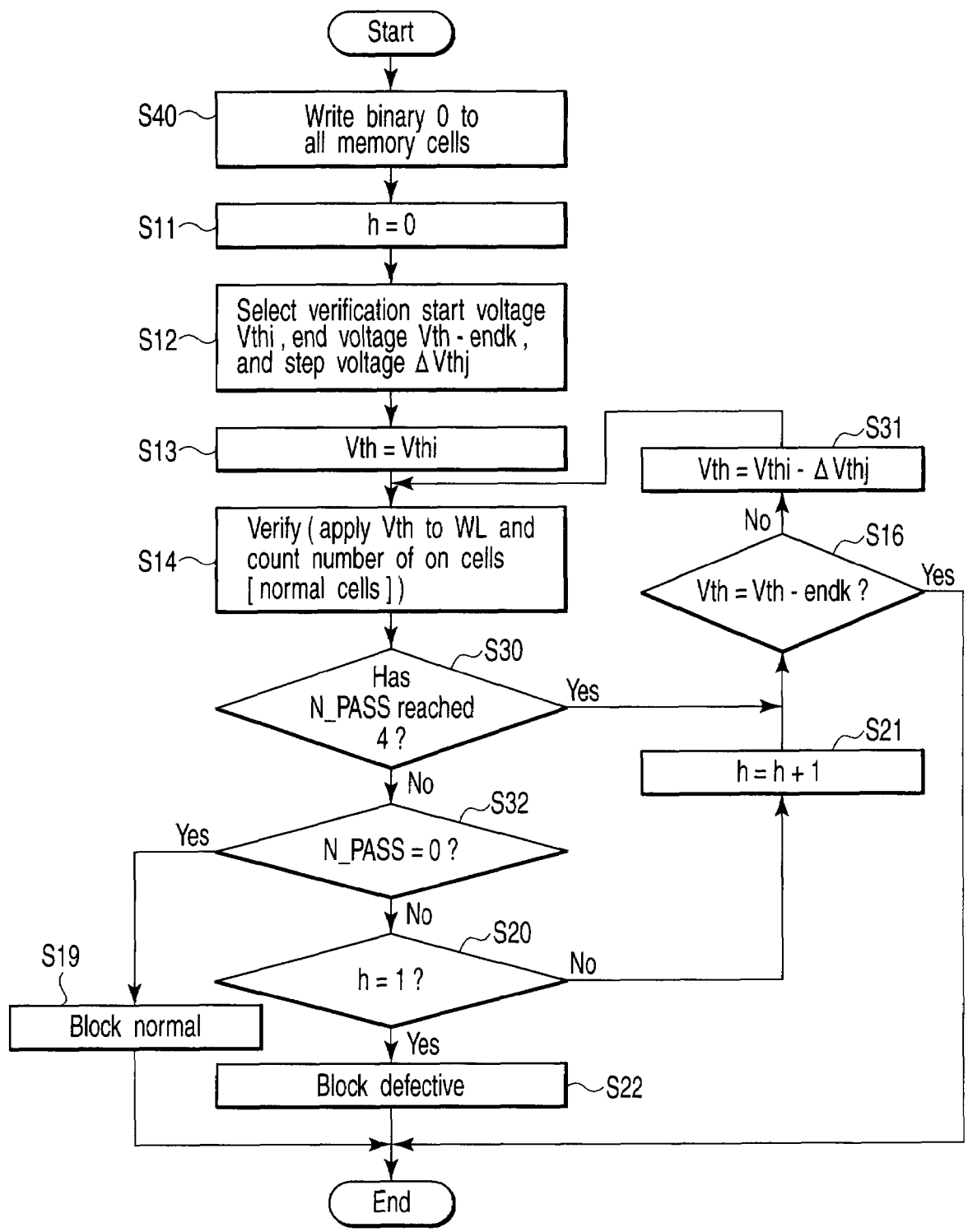
F I G. 21

No isolated bit

Isolated bit present

Isolated bit present

First step

SEMICONDUCTOR INTEGRATED CIRCUIT DEVICE COMPRISING MOS TRANSISTOR HAVING CHARGE STORAGE LAYER AND METHOD FOR TESTING SEMICONDUCTOR MEMORY DEVICE

CROSS-REFERENCE TO RELATED APPLICATIONS

This application is based upon and claims the benefit of priority from prior Japanese Patent Application No. 2006-348004, filed Dec. 25, 2006, the entire contents of which are incorporated herein by reference.

BACKGROUND OF THE INVENTION

1. Field of the Invention

The present invention relates to a semiconductor integrated circuit device and a method for testing a semiconductor memory device. For example, the present invention relates to a method for testing a semiconductor memory including a MOS transistor having a charge storage layer and a control gate.

2. Description of the Related Art

A day-to-day increase in the capacities of semiconductor memories has correspondingly increased the number of memory cells storing data. Each memory cell is manufactured through an enormous number of, for example, several hundred process steps. Thus, it is impossible to enable all memory cells to be produced in the same condition; manufacture of semiconductor memories involves a certain process variation.

Before semiconductor memories with such a process variation are shipped, defective bits are replaced with redundant bits or determined to be defective to prevent initially defective or unreliable products from being shipped. Thus, many electrical inspection steps are executed in a manufacture stage for semiconductor memories.

More accurate screening (sorting of defective parts) methods have been required in order to improve the reliability of increasingly miniaturized semiconductor memories. Various methods have been proposed which use a built-in self-test (BIST) circuit in a semiconductor memory to inspect the memory. Such a method is disclosed in, for example, Jpn. Pat. Appln. KOKAI Publication No. 11-39226.

One of the screening methods is a search of isolated bits. The isolated bit means a memory cell having a threshold voltage deviating from the threshold distribution of all the memory cells (population distribution). Such a memory cell often has degraded reliability, and it is important to search for isolated bits for screening. However, it is very difficult to search for isolated bits by the conventional inspection methods.

BRIEF SUMMARY OF THE INVENTION

A semiconductor integrated circuit device according to an aspect of the present invention includes:

a semiconductor memory which includes a memory block having a plurality of memory cells and which tests the memory cells during a test operation to determine whether or not the memory cells are acceptable; and a test circuit which controls the test operation on the semiconductor memory, the test circuit including a controller which consecutively increments a gate voltage of the memory cells and which controls the semiconductor memory so as to read a data from the memory cells provided with the gate voltage on each memory block; and a counter which measures, for the gate voltage which is incremented by the controller, the number of memory cells determined to be defective depending to the result of reading the data, the controller determining the memory block to be defective when the counter consecutively shows a count falling within a predetermined range during the variation in gate voltage.

A method for testing a semiconductor memory device including a memory block having a plurality of nonvolatile memory cells according to an aspect of the present invention, the method comprising:

performing a data erasing or writing operation on all the memory cells in the memory block at a time;

setting a first threshold voltage and a voltage variation width;

in the memory block, varying a value in increments or decrements of the voltage variation width from the first threshold voltage and counting the number of memory cells having a threshold voltage exceeding the value using a counter configured to count (n+1) bits (n is a natural number greater than or equal to 1); and determining the memory block to be defective when the counter consecutively shows a count of at least 1 and at most n during the variation in the value.

BRIEF DESCRIPTION OF THE SEVERAL VIEWS OF THE DRAWING

FIGS. 8 to 10 are schematic diagrams showing search conditions held by a BIST circuit in accordance with the first embodiment of the present invention;

FIG. 21 is a flowchart showing a method for searching for isolated bits in LSI in accordance with a third embodiment of the present invention;

DETAILED DESCRIPTION OF THE INVENTION

FIRST EMBODIMENT

Figure 1:
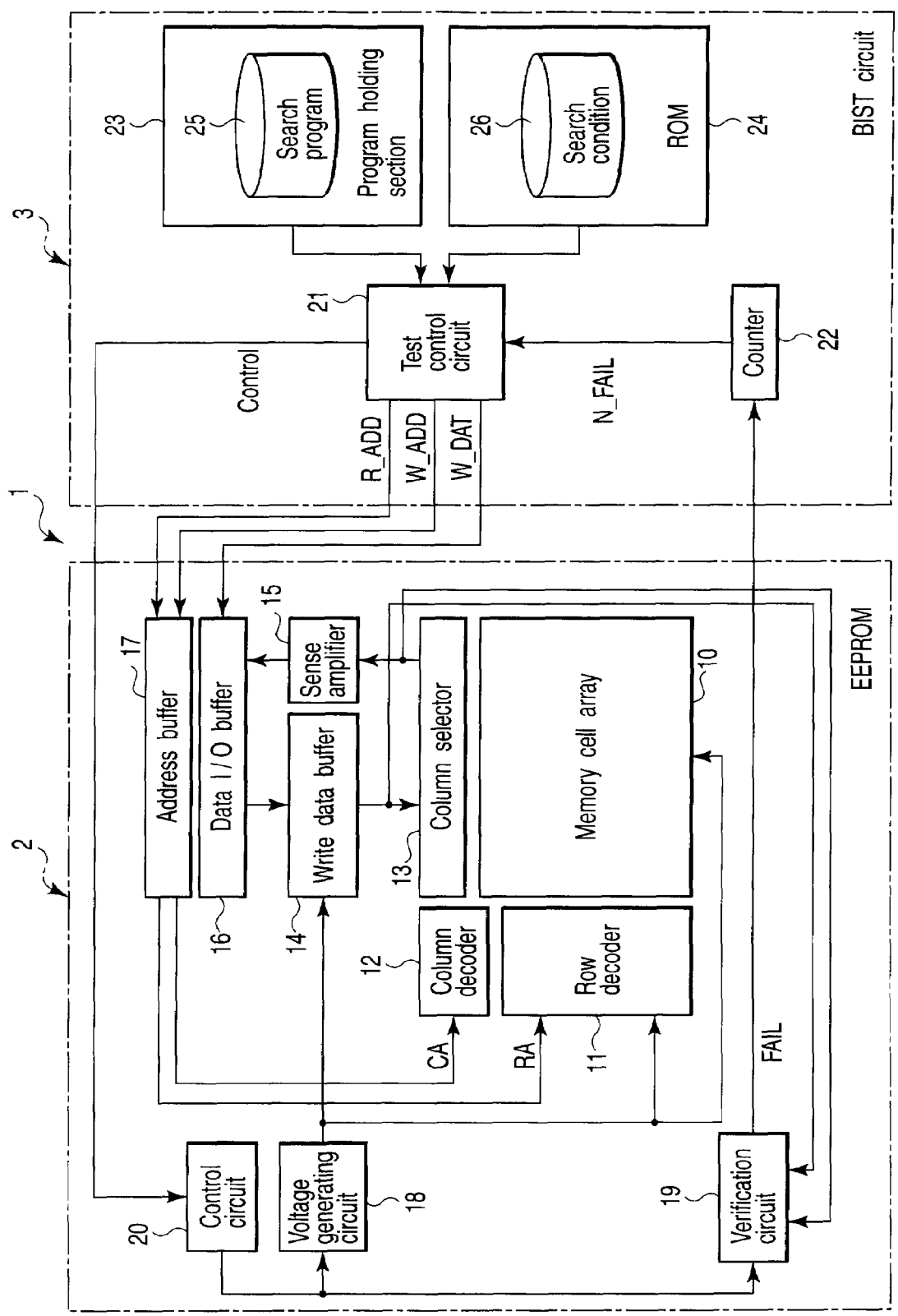
FIG. 1 is a block diagram of LSI in accordance with a first embodiment of the present invention.

Description will be given of a semiconductor integrated circuit device and a method for testing a semiconductor memory device in accordance with a first embodiment of the present invention. FIG. 1 is a block diagram of LSI in accordance with the present embodiment.

As shown in FIG. 1, LSI 1 includes EEPROM 2 and a BIST circuit 3. EEPROM 2 is, for example, a NOR flash memory and stores data. The BIST circuit 3 controls test operations in EEPROM 2.

First, the configuration of EEPROM 2 will be described. As shown in FIG. 1, EEPROM 2 includes a memory cell array 10, a row decoder 11, a column decoder 12, a column selector 13, a write data buffer 14, a sense amplifier 15, a data I/O buffer 16, an address buffer 17, a voltage generating circuit 18, a verification circuit 19, and a control circuit 20.

The memory cell array 10 includes a plurality of NOR flash memory cells arranged in a matrix. Each of the memory cells is connected to a bit line, a word line, and a source line. A row decoder 11 makes selections for the row direction of the memory cell array 10. That is, the row decoder 11 selects a word line. The column decoder 12 makes selections for the column direction of the memory cell array 10. The column selector 13 selects a bit line on the basis of a selecting operation of the column decoder 12 to connect the bit line to the data buffer 14 or the sense amplifier 15. The sense amplifier 15 senses and amplifies data read from a memory cell selected by the row decoder 11 and the column decoder 12. Specifically, the data is determined by comparing a current flowing through a selected bit line, that is, a drain current of the selected memory cell, with a drain current of a reference cell. The write data buffer 14 holds data to be written to memory cells and writes data to a predetermined number of memory cells at a time.

The data I/O buffer 16 receives external data to be written to memory cells and transfers the write data to the write data buffer 14. The data I/O buffer 16 also outputs read data amplified by the sense amplifier 15 to an external device. During the test operation on EEPROM 2, the data I/O buffer 16 receives a write data pattern W_DAT from the BIST circuit 3 and transfers the write data pattern W_DAT to the write data buffer 14.

The address buffer 17 receives an external address signal and transfers a column address CA in the address signal to the column decoder 12 and a row address in the address signal to the row decoder 11. During the test operation on EEPROM 2, the address buffer 17 receives a read address R_ADD and a write address W_ADD from the BIST circuit 3.

The voltage generating circuit 18 generates voltages under the control of the control circuit 20. The voltage generating circuit 18 then supplies the generated voltages to, for example, the row decoder 11, the write data buffer 14, and the memory cell array 10.

The verification circuit 19 performs a verification operation using the data in the write data buffer and the read data amplified by the sense amplifier under the control of the control circuit 20. During the test operation, data to be compared with the read data may be provided directly by the BIST circuit 3. Upon determining a memory cell to be defective as a result of the verification (hereinafter referred to as a failure), the verification circuit 19 outputs a failure signal FAIL to the BIST circuit 3. If the memory cell is determined to be normal, this is referred to as a pass.

The control circuit 20 controls the operation of each of the blocks in EEPROM 2 under the control of the BIST circuit 3.

Figure 2:
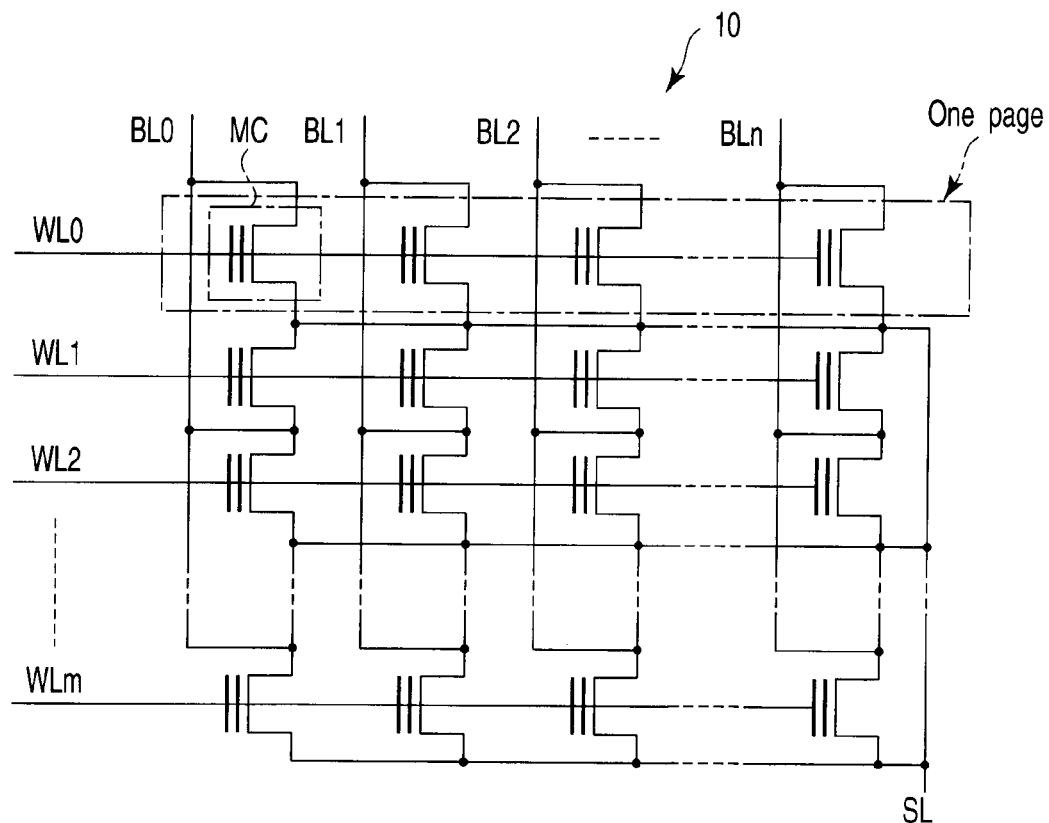
FIG. 2 is a circuit diagram of a memory cell array provided in EEPROM in accordance with the first embodiment of the present invention.

Now, the configuration of the memory cell array 10 will be described with reference to FIG. 2. FIG. 2 is a circuit diagram showing the configuration of the memory cell array 10.

As shown in FIG. 2, the memory cell array 10 includes ((m+1)×(n+1)) (m and n are natural numbers) memory cells MC. The memory cell MC is a MOS transistor having a stack gate including a charge storage layer (for example, a floating gate) and a control gate. The control gates of the memory cells MC on the same row are commonly connected to the same one of word lines WL0 to WLm. The drains of the memory cells MC on the same column are commonly connected to the same one of bit lines BL0 to BLn. For convenience of description, the word lines WL to WLm may hereinafter be collectively refereed to as a word line WL. The bit lines BL0 to BLn may hereinafter be collectively referred to as a bit line BL. Furthermore, the set of (n+1) memory cells MC connected to the same word line is hereinafter referred to as a "page". "One page" has only to be a set of a plurality of memory cells connected to the same word line.

Figure 3:
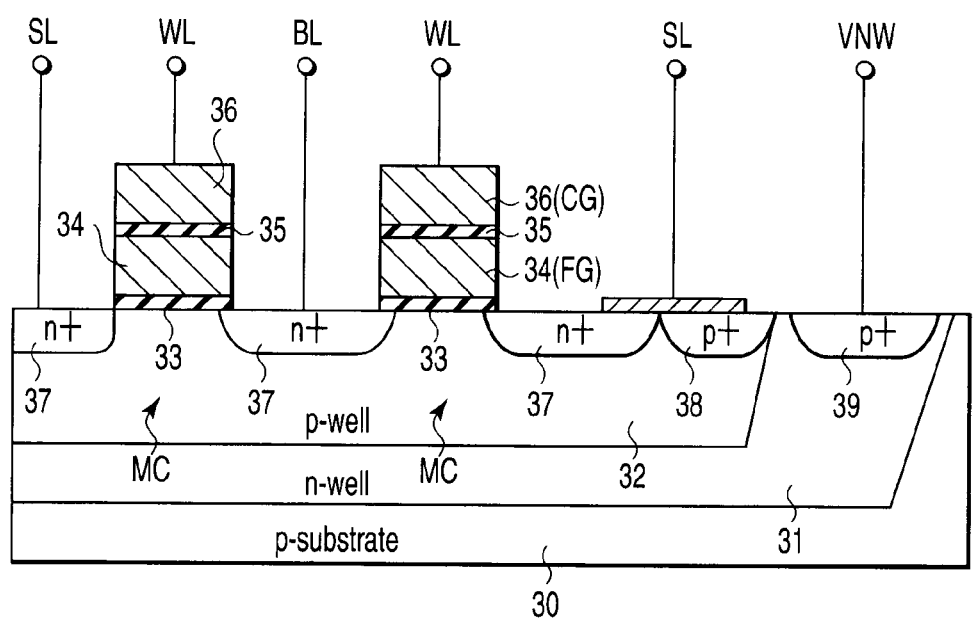
FIG. 3 is a sectional view of the memory cell array provided in EEPROM in accordance with the first embodiment of the present invention.

Now, the sectional configuration of the memory cell MC will be described with reference to FIG. 3. FIG. 3 is a sectional view of a partial area of the memory cell array 10. As shown in the figure, an n-type well region 31 is formed in a surface region of a p-type semiconductor substrate 30. A p-type well region 32 is formed in a surface region of the n-type well region 31. Gate insulating films 33 are formed on the p-type well region 32. A gate electrode of a memory cell MC is formed on each of the gate insulating films 33. The gate electrode of the memory cell MC has a polycrystalline silicon layer 34 formed on the gate insulating film 33 and a polycrystalline silicon film 36 formed on the polycrystalline silicon layer 34 with an inter-gate insulating film 35 interposed therebetween. The inter-gate insulating film 35 is formed of, for example, a silicon oxide film, or an ON film, an NO film, or an ONO film which has a stack structure of a silicon oxide film and a silicon nitride film. The polycrystalline silicon layer 34 functions as a floating gate (FG) and is separately provided in each memory cell MC. On the other hand, the polycrystalline silicon layers 36 adjacent to each other in a direction orthogonal to the bit lines are connected together to function as control gates (word lines WL). An $n^+$-type impurity diffusion layer 37 is formed in a surface of the p-type well region 32 positioned between the adjacent gate electrodes. The impurity diffusion layer 37 is shared by adjacent transistors and functions as a source region or a drain region. The source region of the memory cell MC is connected to a source line SL, and the drain is connected to the bit line BL. A $p^+$-type impurity diffusion layer 38 is formed in a surface region of the p-type well region 32. An $n^+$-type impurity diffusion layer 39 is formed in a surface region of the n-type well region 31. The p-type well region 32 is provided, via the impurity diffusion layer 38, with the same potential as that of the source line SL. The n-type well region 31 is provided with a well voltage VNW via the impurity diffusion layer 39.

Now, referring back to FIG. 1, the configuration of the BIST circuit will be described. As shown in the figure, the BIST circuit 3 includes a test control circuit 21, a counter 22, a program holding section 23, and ROM 24.

The counter 22 counts the number of times that the verification circuit 19 has output the failure signal FAIL. That is, every time the failure signal FAIL is output, the counter counts up the number of output failure signals FAIL to indicate the number of defective memory cells determined as a result of the verification.

The program holding section 23 is, for example, a nonvolatile memory device holding a search program 25 for isolated bits. The search program 25 will be described below in detail.

ROM 24 holds search condition data 26 required to execute the search program 25. The search condition data 26 will also be described below in detail.

The test control circuit 21 reads the search program 25 held in the program holding section 23 and the search condition data 26 held in ROM 24 to perform tests on EEPROM 2. Specifically, the test control circuit 21 searches each memory block in the memory cell array 10 for isolated bits. If any isolated bit is found, the test control circuit 21 manages the memory block as a defective block. The memory block is a set of memory cells MC in the memory cell array 10; data is erased from each memory block at a time. For tests, the test control circuit 21 outputs the write data pattern W_DAT, the write address W_ADD, and the read address R_ADD to EEPROM 2 and controls the operation of the control circuit 20.

Now, a brief description will be given of the concept of the search program 25 for isolated bits executed by the BIST circuit 3 configured as described above. The present embodiment uses an erase verification operation to search for isolated bits.

Figure 4:
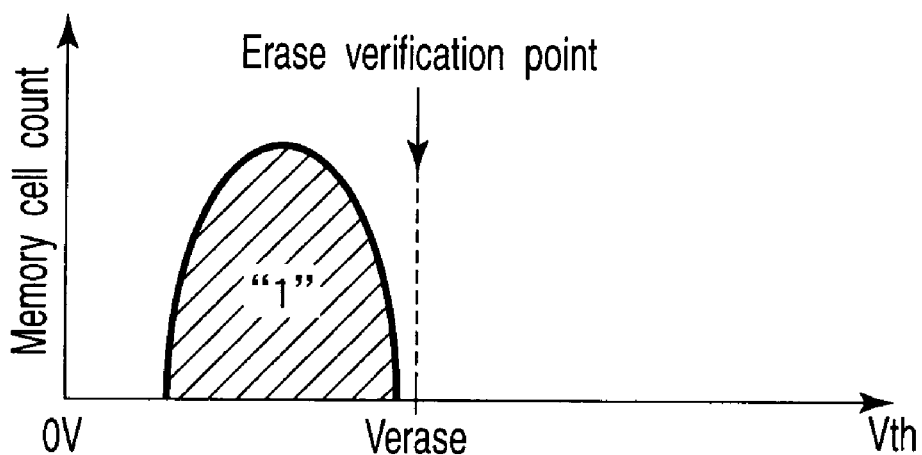
FIG. 4 is a graph showing the threshold distribution of EEPROM.

FIG. 4 is a graph showing the threshold distribution of the memory cells MC included in a memory block. In FIG. 4, a threshold voltage Vth is plotted on the abscissa. The number of memory cells is plotted on the ordinate. The figure shows the case in which no isolated bit is present. As shown in the figure, for a sufficiently reliable memory block for which the manufacturing process and the like pose no problem, the threshold voltages Vth of all the memory cells MC in an erase state (the memory cells hold binary 1 data) are included in a population distribution (main distribution: a shaded area in the figure). Verase in the figure denotes an erase verification point. The threshold voltage of the memory cell MC is set lower than Verase during a verification operation after a data erasing operation.

Figure 5:
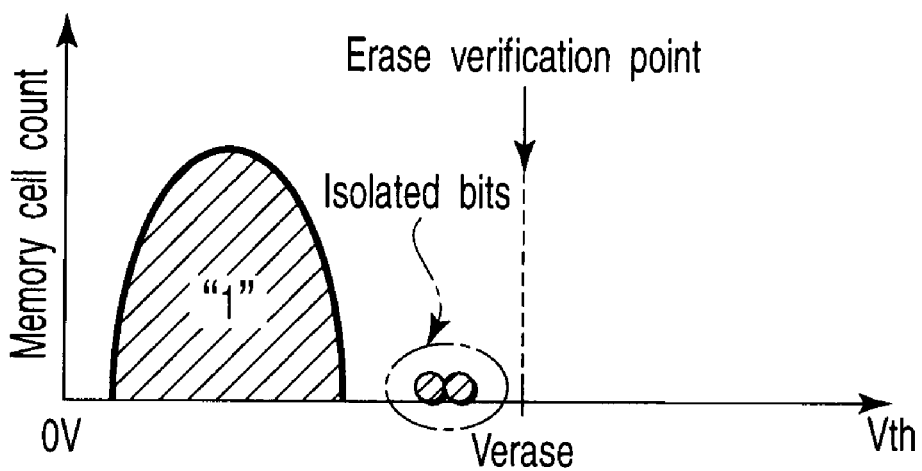
FIG. 5 is a graph showing the threshold distribution of EEPROM having isolated bits.

In contrast, FIG. 5 is a graph showing a threshold distribution obtained when isolated bits are present. As shown in the figure, as a general property of the memory block, if data is easily erased (data is erased at a high speed), the population distribution in FIG. 5 is located in a lower threshold range than that in FIG. 4. In this case, unreliable memory cells MC are erased more slowly than those MC included in the population distribution. Threshold voltages higher than those included in the population distribution may be present away from the population, as shown in the figure. These memory cells MC correspond to isolated bits. Consequently, searching for isolated bits is important in ensuring the reliability of the semiconductor memory.

Figure 6:
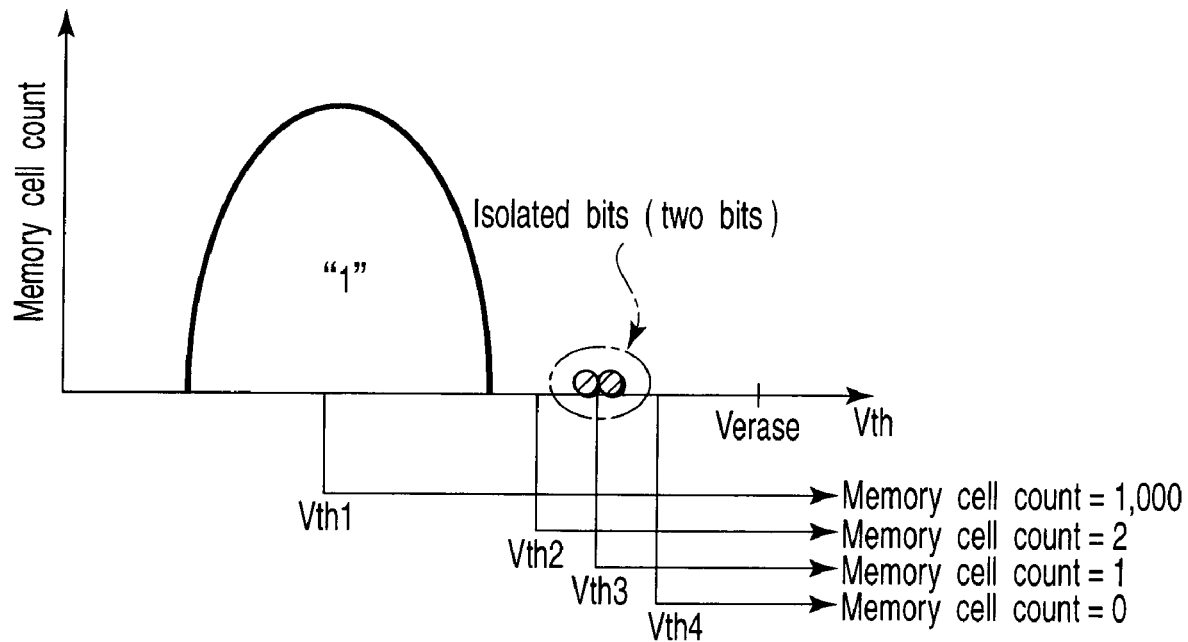
FIG. 6 is a graph showing the threshold distribution of a memory block provided in EEPROM in accordance with the first embodiment of the present invention, and also showing a method for searching for isolated bits.
Figure 7:
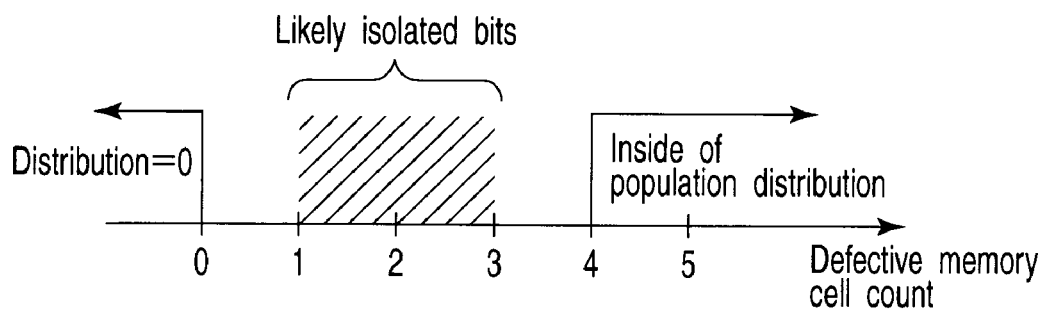
FIG. 7 is a schematic diagram showing the concept of the method for searching for isolated bits in LSI in accordance with the first embodiment of the present invention.

To search for isolated bits, the test control circuit 21 in the BIST circuit 3 verifies a plurality of threshold voltages. That is, the voltage is consecutively verified in increments of a certain step voltage starting with a verification start voltage and ending with a verification end voltage. The verification operation includes varying the voltage of the word line WL in increments of the step voltage starting with the verification start voltage to observe whether the memory cell is turned on or off. If the memory cell is turned on, the test control circuit 21 determines that the memory cell has passed the test. If the memory cell is turned off, the test control circuit 21 determines that the memory cell has failed the test and outputs the failure signal. Then if a predetermined criterion is met as a result of a consecutive verification, the test control circuit 21 determines the presence of isolated bits. This will be described with reference to FIGS. 6 and 7. FIG. 6 is a graph showing the threshold distribution of a memory block having isolated bits. FIG. 7 is a conceptual drawing showing a determination criterion for the presence of isolated bits.

As shown in FIG. 6, it is assumed that two memory cells MC correspond to isolated bits (these memory cells MC are hereinafter simply referred to as isolated bits) and that 1,000 memory cells MC have a threshold voltage higher than a threshold voltage Vth1. A threshold voltage Vth2 has a value between the threshold voltage Vth1 and the threshold voltages of the memory cells MC corresponding to the isolated bits. A threshold voltage Vth3 is intermediate between the threshold voltages of the two isolated bits. A threshold voltage Vth4 is higher than the threshold voltages of the isolated bits. Then, a verification for the threshold voltage Vth1 (that is, performing a reading operation with the voltage of the word line WL set at Vth1) determines the 1,000 memory cells MC to be defective (the 1,000 memory cells are turned off). Verifications for the threshold voltages Vth2, Vth3, and Vth4 determine two memory cells MC, one memory cell MC, and zero memory cell MC, respectively, to be defective.

As shown in FIG. 7, when a distribution with at least one and at most three memory cells MC is found, the test control circuit 21 determines that the distribution is likely to include isolated bits. The test control circuit 21 determines a distribution with at least four memory cells MC to be included in the population distribution. With zero memory cell MC, no memory cell MC has a threshold voltage higher than the one of interest, and no isolated bit is thus present. Thus, if a distribution with one to three memory cells MC is found, the test control circuit 21 determines that the distribution is likely to include isolated bits. If such a distribution is found in two consecutive verifications, the distribution is determined to include isolated bits.

In the description of the present embodiment, the determination criterion for isolated bits is that the number of memory cells MC is one to three. However, an upper limit (X) and a lower limit for the number can be appropriately selected. For example, the number may be set to be the range from 1 to 10 (X=10). The counter in the BIST circuit 3 has only to count at least 1 to (X+1). Consequently, according to the present embodiment, a sufficient upper limit for count in the counter 22 is at least 4.

Now, the search condition data 26 held in ROM 24 in the BIST circuit 3 will be described with reference to FIGS. 8 to 10. FIGS. 8 to 10 are tables showing specific examples of the search condition data 26. The search condition data 26 includes the verification start voltage, verification end voltage, and step voltage for consecutive verifications with the threshold voltage varied. FIG. 8 shows the verification start voltage; a plurality of initial threshold voltages used when the verification is started are held in ROM 24. The verification start voltage is hereinafter referred to as a threshold voltage Vthi (i is a natural number greater than or equal to 1). FIG. 9 shows the verification end voltage; a plurality of final threshold voltages used when the verification is ended are held in ROM 24. The verification end voltage is hereinafter referred to as a threshold Vth-endk (k is a natural number greater than or equal to 1). FIG. 10 shows the step voltage; a plurality of voltage variation widths used when consecutive verifications are performed are held in ROM 24. The step voltage is hereinafter referred to as $\Delta Vthj$ (j is a natural number greater than or equal to 1).

Figure 11:
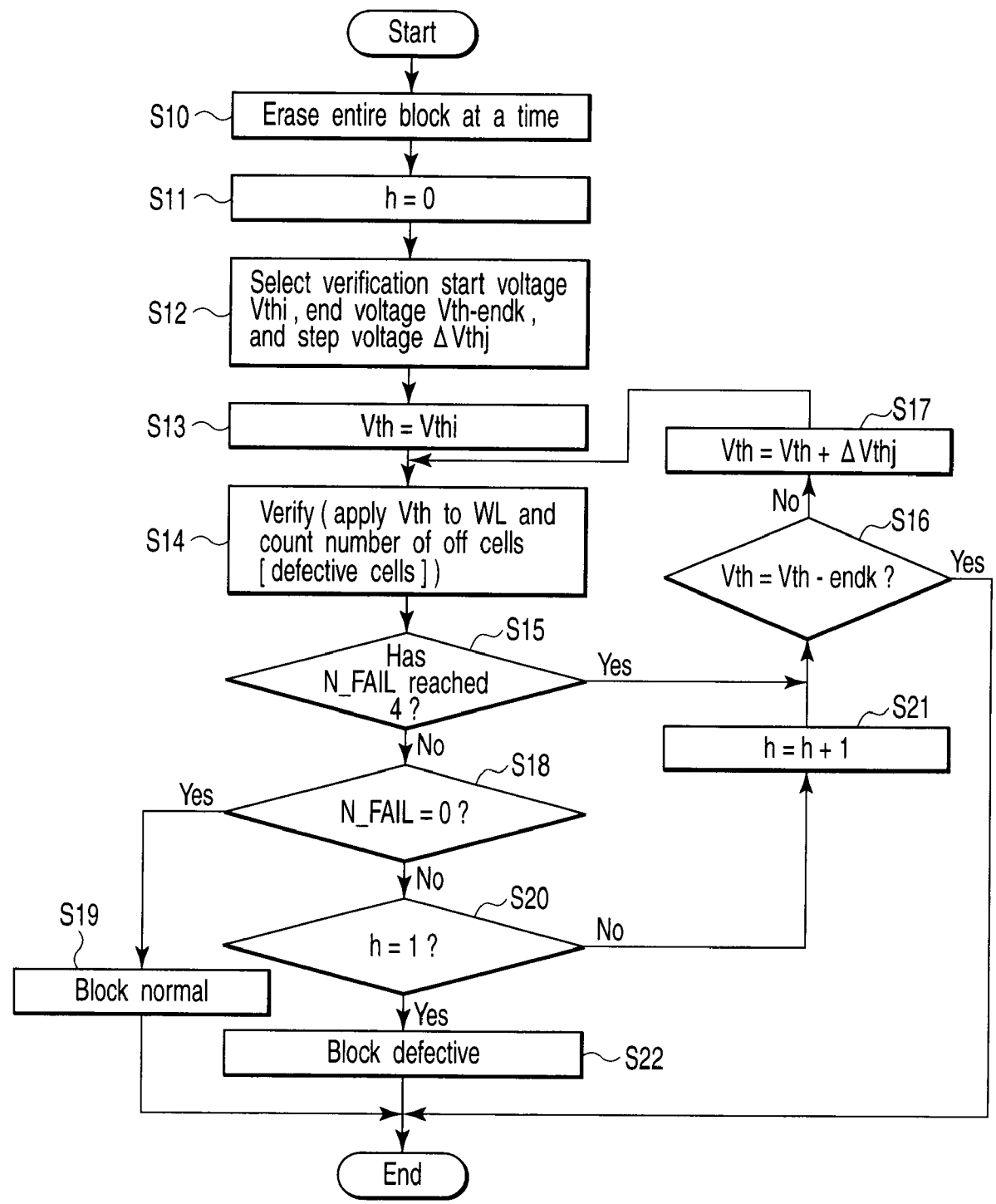
FIG. 11 is a flowchart showing the method for searching for isolated bits in LSI in accordance with the first embodiment of the present invention.

Now, with reference to FIG. 11, a detailed description will be given of the method for searching for isolated bits which method is executed by the BIST circuit 3. FIG. 11 is a flowchart of the isolated bit search method. The flowchart shown in FIG. 11 corresponds to the contents of the search program 25. The test control circuit 21 reads the search program 25 from the program holding section 23 and executes the process shown in FIG. 11.

As shown in the figure, the test control circuit 21 first instructs the control circuit 20 for EEPROM 2 to erase data from a test target memory block in the memory cell array 10 (step S10). This allows data to be erased from all the memory cells MC in the memory block, making the threshold voltages of the memory cells MC less than or equal to the erase verification level Verase. The test control circuit 21 holds h=0 in, for example, a register held in the test control circuit 21 (step S11). Here, "h" means the number of times that a distribution with 1 to 3 memory cells has been found.

The test control circuit 21 selects the verification start voltage Vthi, the verification end voltage Vth-endk, and the step voltage $\Delta Vthj$ from ROM 24 (step S12). This step may be executed before the erase operation in step S10.

The test control circuit 21 sets the threshold voltage Vth for the first verification equal to the verification start voltage Vthi determined in step S21 (step S13). The test control circuit 21 then instructs the control circuit 20 for EEPROM 2 to perform verification for the threshold Vth determined in step S13 (step S14). The flow of step S14 will be described below in brief.

The test control circuit 21 first provides the read address R_ADD to the address buffer 17 in EEPROM 2. The read address R_ADD is a leading address at which the corresponding data starts to be read. On the basis of the read address R_ADD, the row decoder 11 and the column decoder 21 performs operations of selecting the word line WL and the bit line BL, respectively. The control circuit 21 instructs the voltage generating circuit 18 to generate the voltage Vth. In response to the instruction, the voltage generating circuit 18 generates the voltage Vth. The row decoder 11 then applies the voltage Vth to the selected word line. As a result, data is read from the selected memory cell MC. The verification circuit 19 then determines whether or not the data is binary 0, that is, whether or not the selected memory cell MC is turned on. Since the data is erased in step S10, if the memory cell MC is turned off, the verification circuit 19 determines the memory cell MC to be defective and outputs the failure signal FAIL. The output failure signal FAIL is provided to the counter 22, which counts the number of times that the failure signal FAIL has been output. The count is hereinafter referred to as a count N_FAIL. The control circuit 21 performs the above-described read operation on the target memory block.

When N_FAIL reaches 4 at any point (step S15, YES), the test control circuit 21 determines that the voltage Vth is included in the population distribution. The test control circuit 21 thus determines whether or not the voltage Vth is equal to the verification end voltage Vth-endk. If the voltage Vth is not equal to the verification end voltage Vth-endk (step S16, NO), the test control circuit 21 increases the voltage Vth by the step voltage $\Delta Vthj$ (step S17) and repeats the processing in step S14. If the voltage Vth is equal to the verification end voltage Vth-endk (step S16, YES), the search is ended. In this case, the presence or absence of isolated bits cannot be determined. Thus, a similar process is repeated with the verification start voltage, the verification end voltage, the step voltage, and the like changed.

In step S15, if N_FAIL has not reached 4 as a result of the verification of all the memory cells MC (step S15, NO), the test control circuit 21 determines whether or not N_FAIL is zero. If N_FAIL is zero (step S18, YES), no memory cell MC has a threshold voltage higher than the voltage Vth. The test control circuit 21 thus finally determines that the memory block is normal (step S19).

In step S18, if N_FAIL is not zero (step S18, NO), N_FAIL is 1, 2, or 3. That is, isolated bits are likely to be present. The test control circuit 21 checks the register to determine whether or not h=1. This means the determination of whether or not a distribution likely to include isolated bits has already been found. If h is not 1 (step S20, NO), that is, h=0 and such a distribution has not been found yet, then the test control circuit 21 sets h=h+1=1 (step S21) and returns to step S16. If Vth is not equal to Vth-endk, the test control circuit 21 executes the processing in step S17 and repeats the processing in step S14 and the subsequent steps.

If the test control circuit 21 determines in step S20 that h=1 (step S21, YES), a distribution likely to include isolated bits has been found twice. The test control circuit 21 thus determines that the memory cells MC having the voltage Vth as a threshold are isolated bits. The test control circuit 21 finally determines that the memory block is defective (step S22).

The above-described process will be described taking specific examples. In CASE1, isolated bits are present, and in CASE2, no isolated bit is present.

<CASE1>

Figure 12:
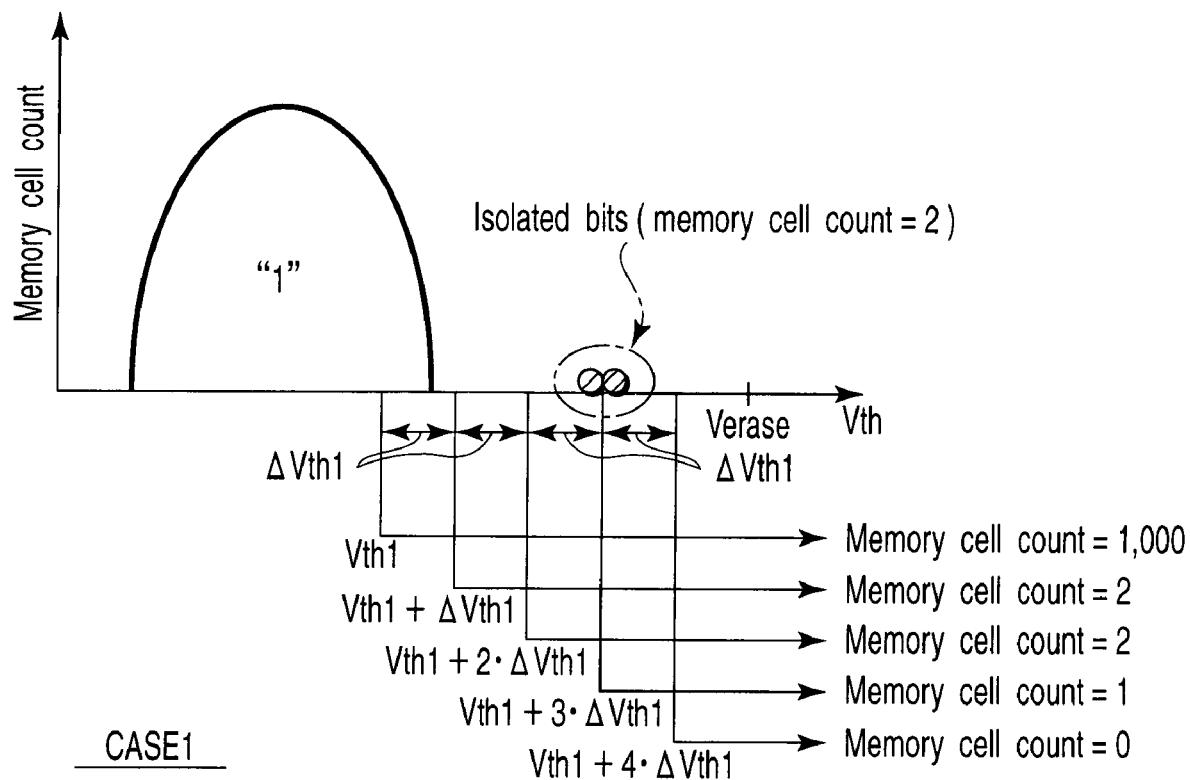
FIG. 12 is a graph showing the threshold distribution of a memory block provided in EEPROM in accordance with the first embodiment of the present invention, and also showing a method for searching for isolated bits.

First, the case in which isolated bits are present will be described. FIG. 12 is a graph showing the threshold distribution of the memory cells MC in the memory cell block. For example, it is assumed that two isolated bits are present. With this distribution, a search for isolated bits is performed using the verification start voltage VTh1 and the step voltage $\Delta Vth1$, as shown in FIG. 12. It is assumed that 1,000 memory cells have a threshold voltage exceeding Vth1, two memory cells have a threshold voltage exceeding (Vth1+$\Delta Vth1$), two memory cells have a threshold voltage exceeding (Vth1+ 2·ΔVth1), one memory cell has a threshold voltage exceeding (Vth1+3·ΔVth1), and no memory cell has a threshold voltage exceeding (Vth1+4·ΔVth1). The description of the verification end voltage is omitted.

Figure 13:
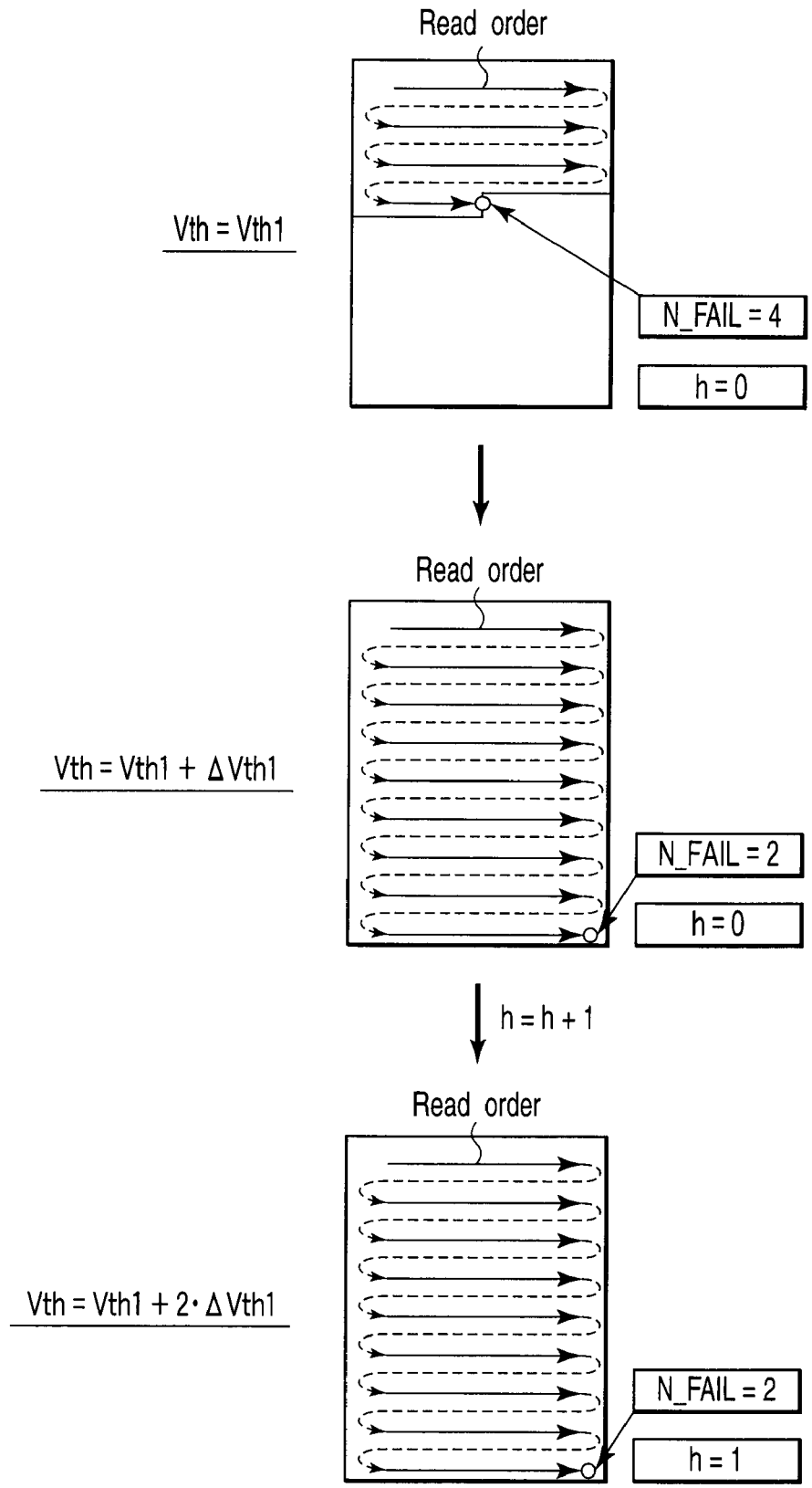
FIG. 13 is a graph showing the threshold distribution of the memory block provided in EEPROM in accordance with the first embodiment of the present invention, and also showing the method for searching for isolated bits.

FIG. 13 is a schematic diagram of a memory block showing a part of the flow of the process shown in FIG. 11. The test control circuit 21 performs a verification operation with the threshold voltage Vth set at Vth1 (steps S12 to S14). Then, since the 1,000 memory cells have a threshold voltage greater than or equal to Vth1 as described with reference to FIG. 12, the count N_FAIL in the counter 22 reaches 4 before the verification operation is finished for all the memory cells MC in the memory block (step S15, YES), as shown in FIG. 13.

The test control circuit 21 thus sets Vth=(Vth+ΔVth1)= (Vth1+ΔVth1) (step S17) and performs the verification operation again (step S14). Then, since the two memory cells have a threshold voltage greater than or equal to (Vth1+ ΔVth1) as described with reference to FIG. 12, once the verification operation is finished for all the memory cells MC in the memory block, the count N_FAIL in the counter 22 becomes 2 (step S15, NO), as shown in FIG. 13. At this point, the register in the test control circuit 21 shows h=0 (step S20, NO).

The test control circuit 21 thus sets h=1 (step S21) and also sets Vth=(Vth+ΔVth1)=(Vth1+2·ΔVth1) (step S17) and performs the verification operation again (step S14). Then, since the two memory cells have a threshold voltage greater than or equal to (Vth1+2·ΔVth1), once the verification operation is finished for all the memory cells MC in the memory block, the count N_FAIL in the counter 22 becomes 2 (step S15, NO; step S18, NO), as shown in FIG. 13. At this point, the register in the test control circuit 21 holds h=1 (step S20, NO). The test control circuit 21 then recognizes the presence of isolated bits (step S22). The test control circuit 21 then manages the block as a defective one, and for example, replaces the block on the basis of block redundancy.

<CASE2>

Figure 14:
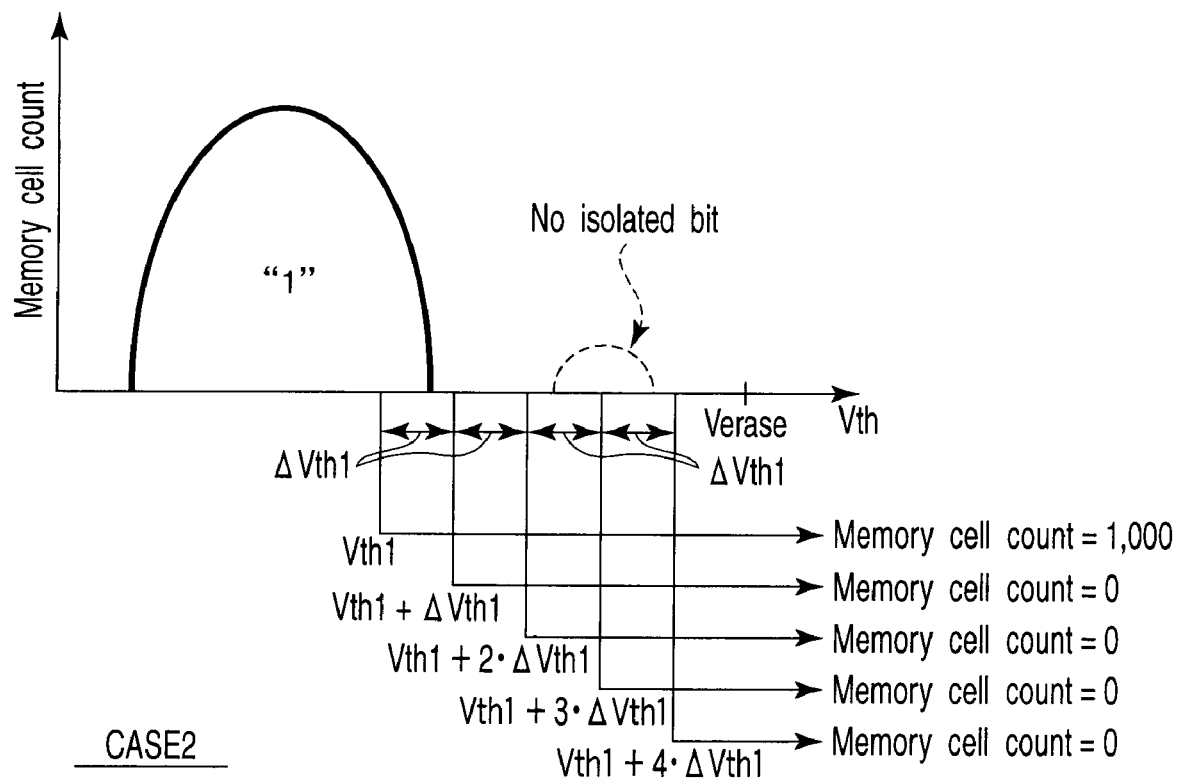
FIG. 14 is a graph showing the threshold distribution of the memory block provided in EEPROM in accordance with the first embodiment of the present invention, and also showing the method for searching for isolated bits.

Now, the case in which no isolated bit is present will be described. FIG. 14 is a graph showing the threshold distribution of the memory cells MC in the memory cell block. As shown in the figure, it is assumed that threshold voltages corresponding to a base of a population distribution are located between Vth1 and (Vth1+ΔVTh1).

Figure 15:
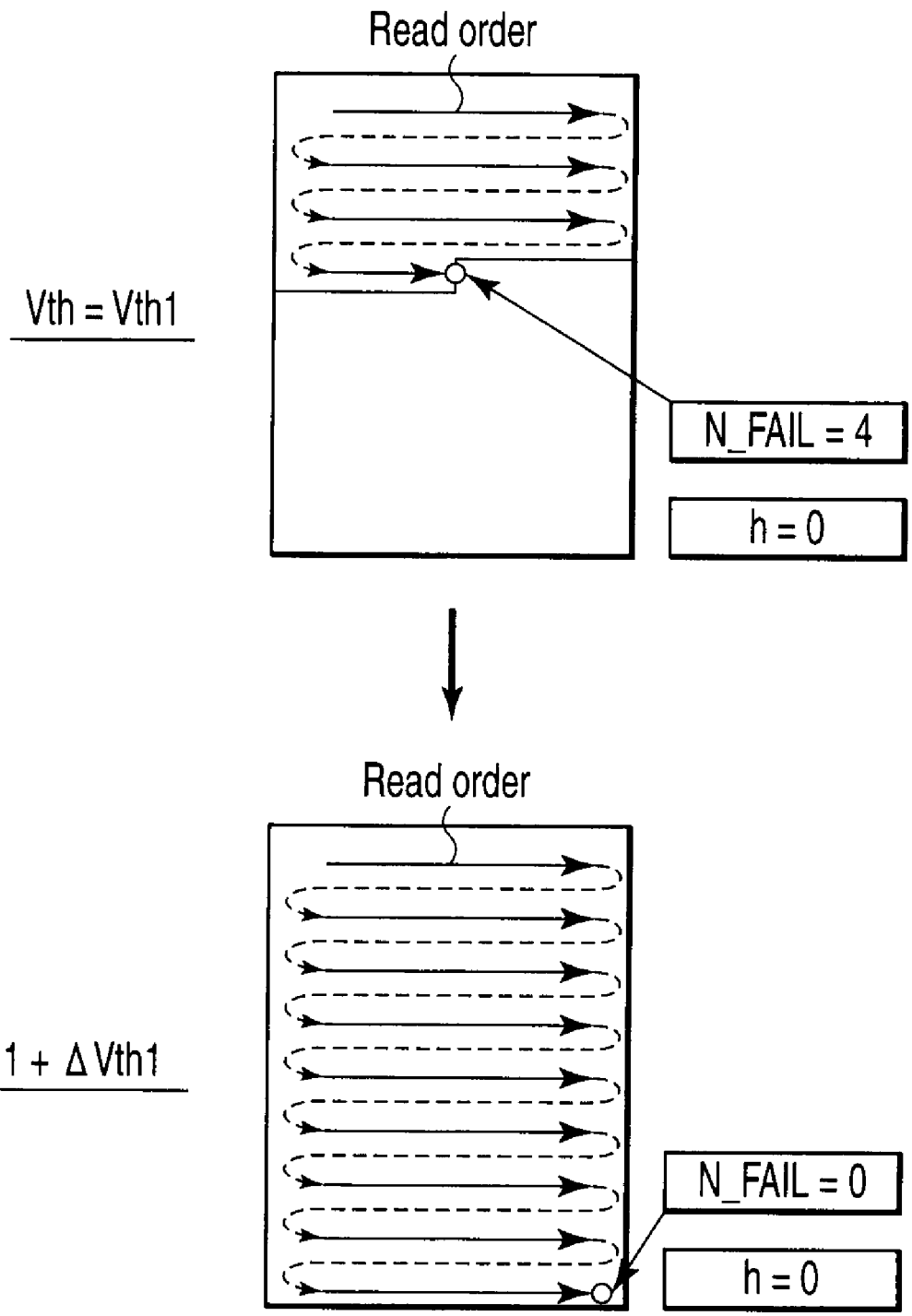
FIG. 15 is a graph showing the threshold distribution of the memory block provided in EEPROM in accordance with the first embodiment of the present invention, and also showing the method for searching for isolated bits.

FIG. 15 is a schematic diagram of a memory block showing a part of the flow of the process shown in FIG. 11. First, the test control circuit 21 performs the verification operation with the verification start voltage Vth1 set equal to the threshold voltage Vth (steps S12 to S14). Then, as in the case of FIG. 13, before the verification operation is finished for all the memory cells MC in the memory cell block, the count N_FAIL in the counter 22 reaches 4 (step S15, YES).

The test control circuit 21 sets Vth=(Vth1+ΔVTh1) (step S17) and performs the verification operation (step S14). Then, since no memory cell has a threshold voltage greater than or equal to (Vth1+ΔVth1), as shown in FIG. 14, once the verification operation is finished for all the memory cells MC in the memory block, the count N_FAIL in the counter 22 becomes zero (step S15, NO; step S18, YES), as shown in FIG. 15. At this point, the test control circuit 21 recognizes the absence of isolated bits and determines the memory block to be normal (step S19).

As described above, LSI in accordance with the present embodiment enables the reliability of semiconductor memories to be improved. This effect will be described below.

The ideal erase property of the nonvolatile semiconductor memory is such that the erase property of each of the memory cells MC in the memory block does not vary significantly. That is, the threshold voltages of all the memory cells MC in the erase state are desirably included in the population distribution. However, the erase property is significantly affected by a variation in manufacturing process. This also affects the reliability of the memory cells MC. It is thus important to provide remedy measures for memory cells MC having threshold voltages deviating significantly from the population distribution, that is, isolated bits. The remedy measures include a method of replacing a memory cell block including isolated bits with a redundancy memory block provided in the memory cell array 10 (block redundancy).

Thus, a search for isolated bits is important in improving the reliability of the semiconductor memory. If a certain threshold level is uniquely set at a value smaller than that of the erase verification voltage and the criterion for the presence of isolated bits is, for example, one to three appropriate memory cells, the conventional method determines the presence of isolated bits when one to three memory cells have a threshold higher than a set threshold level. However, if the set threshold level is, for example, Vth4, shown in FIG. 6, the conventional method cannot find the isolated bits. Furthermore, if the set threshold level is located at the base of the population distribution, the conventional method may determine memory cells MC included in the population distribution to be also defective. Consequently, the conventional method is not an accurate search method. Another possible method is to determine the shape of the entire population distribution. However, disadvantageously, this method requires a very long time and is thus not practical.

In contrast, the configuration in accordance with the present embodiment has the BIST circuit in LSI 1. Then, under the control of the BIST circuit 3, the verification operation is performed with the threshold varied, and the number of failure signals is counted.

Thus, a search for isolated bits can be achieved without the need to determine the shape of the entire population distribution. Furthermore, if the criterion for the presence of isolated bits is X appropriate memory cells, the counter has only to be able to count the number up to (X+1). In this case, once the count reaches (X+1), the verification operation at the current threshold level is finished. That is, as described with reference to FIGS. 13 and 15, if the threshold level is included in the population distribution, a reading operation has only to be performed on some of the memory cells MC. This makes it possible to accurately search for isolated bits while sharply reducing the time required for the search. Moreover, instead of a test apparatus as used in the conventional method, the present embodiment uses the BIST circuit 3 in LSI 1 to search for isolated bits. This enables an increase in the speed at which the presence or absence of isolated bits is determined.

SECOND EMBODIMENT

Figure 16:
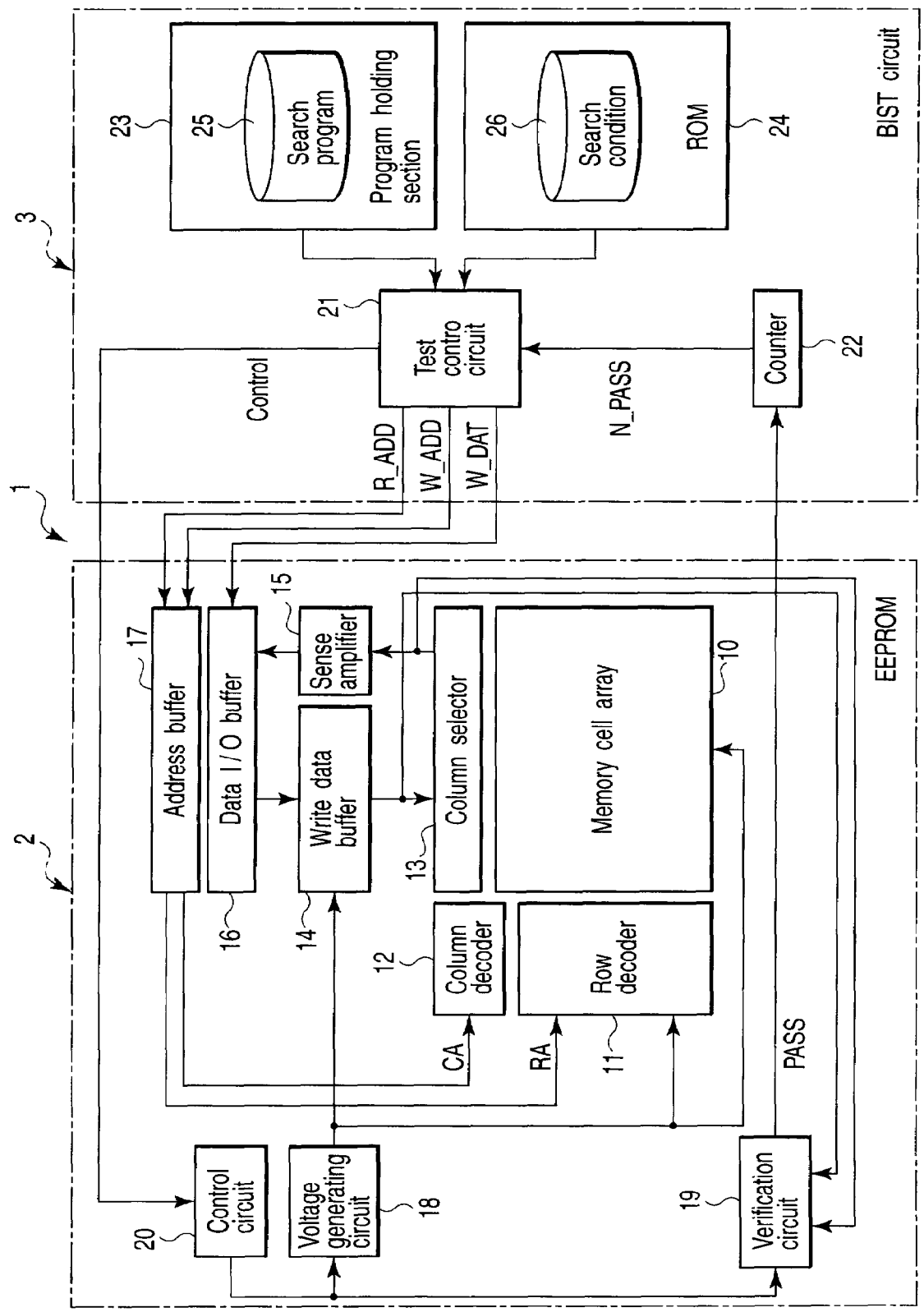
FIG. 16 is a block diagram of LSI in accordance with a second embodiment of the present invention.

Now, description will be given of a semiconductor integrated circuit device and a method for testing a semiconductor memory device in accordance with a second embodiment of the present invention. The present embodiment corresponds to the method for searching for isolated bits in accordance with the first embodiment wherein the isolated bits have threshold voltages lower than those included in the population distribution. FIG. 16 is a block diagram of LSI in accordance with the present embodiment.

As shown in FIG. 16, the configuration of LSI 1 is almost the same as that in the first embodiment. Thus, only differences from the configuration in accordance with the first embodiment will be described below.

First, upon determining that a memory cell is normal, the verification circuit 19 in EEPROM 2 outputs the pass signal PASS to the BIST circuit 3. The counter 22 counts the number of pass signals PASS output by the verification circuit 19. That is, the counter 22 counts up the number every time the pass signal PASS is output, to count the number of memory cells determined to be normal as a result of verification. The search program 25 held in the program holding section 23 will be described below in detail. ROM 24 holds the search condition data 26 required to execute the search program 25. The search condition data 26 in accordance with the present embodiment differs from that in accordance with the first embodiment in that in the first embodiment, the verification start voltage is lower than the verification end voltage, whereas in the present embodiment, the verification end voltage is lower than the verification start voltage. The other arrangements and operations are similar to those in the first embodiment and will thus not be described below.

Figure 17:
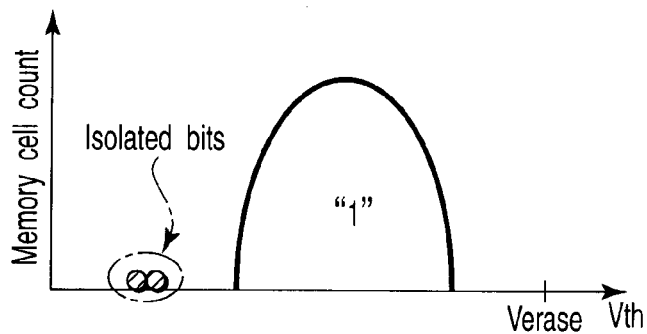
FIG. 17 is a graph showing the threshold distribution of EEPROM.

Now, description will be given of a method for searching for isolated bits which method is executed by the BIST circuit 3 configured as described above. FIG. 17 is a graph showing the threshold distribution of the memory cells MC in the erase state included in the search target memory block, and also showing isolated bits to be searched for in the present embodiment. As shown in FIG. 17, memory cells MC may be present which have threshold levels much lower than those included in the population distribution. These memory cells MC result from a defective manufacturing process or the like and allow data to be erased at excessively high speeds. The memory cells MC are thus not preferable. The present embodiment thus searches for isolated bits having threshold voltages lower than those included in the population distribution.

The general concept of the search method is similar to that in the first embodiment except that the verification is repeated with the threshold level reduced and that the counter 22 counts the number of pass signals instead of failure signals.

Figure 18:
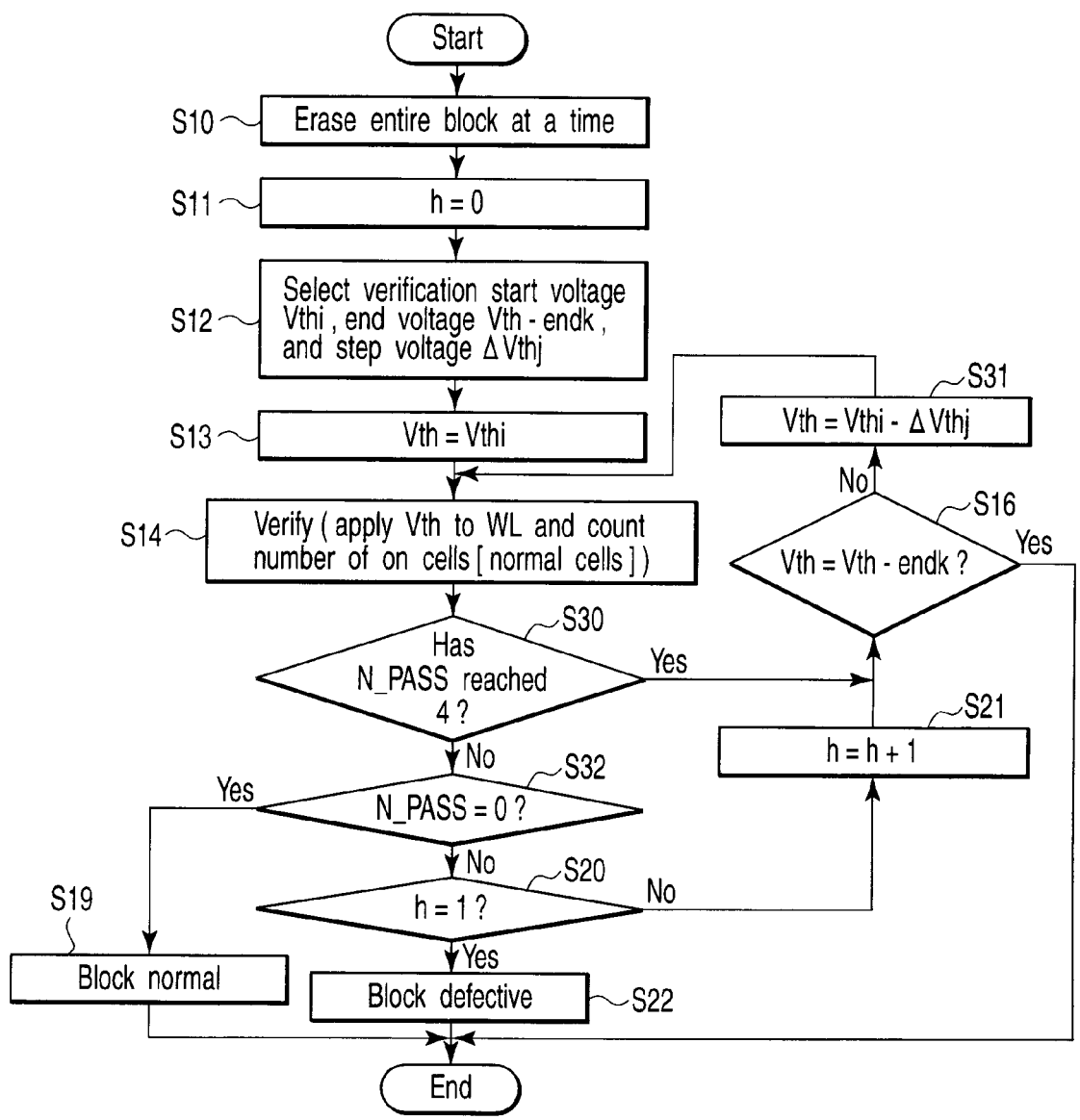
FIG. 18 is a flowchart showing a method for searching for isolated bits in LSI in accordance with the second embodiment of the present invention.

FIG. 18 is a flowchart of a method of searching for isolated bits in accordance with the present embodiment, showing the contents the search program 25. As shown in the figure, the test control circuit 21 first executes the processing in steps S10 to S14, described with reference to FIG. 11, as is the case with the first embodiment.

In step S14, the test control circuit 21 controls EEPROM 2 as follows. The test control circuit 21 first provides the read address R_ADD to the address buffer 17 in EEPROM 2. On the basis of the read address R_ADD, the row decoder 11 and the column decoder 21 performs operations of selecting the word line WL and the bit line BL, respectively. The control circuit 21 instructs the voltage generating circuit 18 to generate the voltage Vth. In response to the instruction, the voltage generating circuit 18 generates the voltage Vth. The row decoder 11 then applies the voltage Vth to the selected word line. As a result, data is read from the selected memory cell MC. The verification circuit 19 then determines whether or not the data is binary 0, that is, whether or not the selected memory cell MC is turned on. Upon determining that the memory cell MC is normal, the verification circuit 19 outputs the pass signal PASS. The output pass signal PASS is provided to the counter 22, which counts the number of times that the pass signal PASS has been output. That is, the counter 22 counts the number of turned-on memory cells, namely the number of normal memory cells. The count is hereinafter referred to as a count N_PASS. The control circuit 21 performs the above-described read operation on the target memory block.

When N_PASS reaches 4 at any point (step S30, YES), the test control circuit 21 determines that the voltage Vth is included in the population distribution. The test control circuit 21 thus determines whether or not the voltage Vth is equal to the verification end voltage Vth-endk. If the voltage Vth is not equal to the verification end voltage Vth-endk (step S16, NO), the test control circuit 21 reduces the voltage Vth by the step voltage $\Delta$Vthj (step S31) and repeats the processing in step S14. If the voltage Vth is equal to the verification end voltage Vth-endk (step S16, YES), the search is ended.

In step S30, if N_PASS has not reached 4 as a result of the verification of all the memory cells MC (step S30, NO), the test control circuit 21 determines whether or not N_PASS is zero. If N_PASS is zero (step S32, YES), no memory cell MC has a threshold voltage lower than the voltage Vth. The test control circuit 21 thus finally determines that the memory block is normal (step S19).

In step S32, if N_PASS is not zero (step S32, NO), N_PASS is 1, 2, or 3. That is, isolated bits are likely to be present. The test control circuit 21 checks the register to determine whether or not h=1. This means the determination of whether or not a distribution likely to include isolated bits has already been found. If h is not 1 (step S20, NO), that is, h=0 and such a distribution has not been found yet, then the test control circuit 21 sets h=h+1=1 (step S21) and returns to step S16. If Vth is not equal to Vth-endk, the test control circuit 21 executes the processing in step S31 and repeats the processing in step S14 and the subsequent steps.

If the test control circuit 21 determines in step S20 that h=1 (step S21, YES), a distribution likely to include isolated bits has been found twice. The test control circuit 21 thus determines that the memory cells MC having the voltage Vth as a threshold are isolated bits. The test control circuit 21 finally determines that the memory block is defective (step S22).

Figure 19:
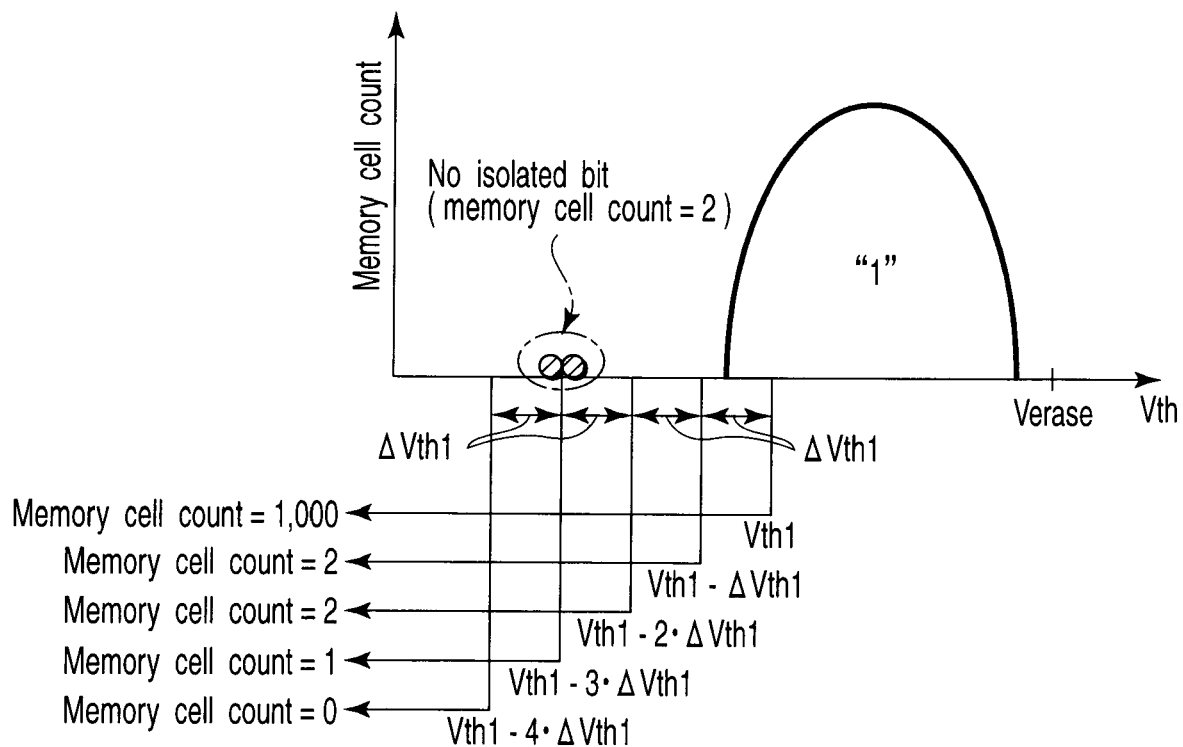
FIG. 19 is a graph showing the threshold distribution of a memory block provided in EEPROM in accordance with the second embodiment of the present invention, and also showing a method for searching for isolated bits.

The above-described process will be described taking specific examples. FIG. 19 is a graph showing the threshold distribution of the memory cells MC in the memory cell block, wherein two isolated bits are present.

A search for isolated bits is performed using the verification start voltage Vth1 and the step voltage $\Delta$Vth1, as shown in FIG. 19. It is assumed that 1,000 memory cells have a threshold voltage lower than Vth1, two memory cells have a threshold voltage less than or equal to (Vth1−$\Delta$Vth1), two memory cells have a threshold voltage less than or equal to (Vth1−2·$\Delta$Vth1), one memory cell has a threshold voltage less than or equal to (Vth1−3·$\Delta$Vth1), and no memory cell has a threshold voltage less than or equal to (Vth1−4·$\Delta$Vth1). The description of the verification end voltage Vth-endk is omitted.

The test control circuit 21 performs the verification operation with the threshold voltage Vth set at Vth1 (steps S12 to S14). Then, since the 1,000 memory cells have a threshold voltage less than or equal to Vth1, the count N_PASS in the counter 22 reaches 4 before the verification operation is finished for all the memory cells MC in the memory block (step S30, YES).

The test control circuit 21 thus sets Vth=(Vth−$\Delta$Vth1)= (Vth1−$\Delta$Vth1) (step S31) and performs the verification operation again (step S14). Then, since the two memory cells have a threshold voltage less than or equal to (Vth1+$\Delta$Vth1), the count N_PASS in the counter 22 becomes 2 (step S30, NO; step S32, NO). At this point, the register in the test control circuit 21 shows h=0 (step S20, NO).

The test control circuit 21 thus sets h=1 (step S21) and also sets Vth=(Vth−ΔVth1)=(Vth1−2·ΔVth1) (step S31) and performs the verification operation again (step S14). Then, since the two memory cells have a threshold voltage greater than or equal to (Vth1−2·ΔVth1), the count N_PASS in the counter 22 becomes 2 (step S30, NO; step S32, NO). At this point, the register in the test control circuit 21 holds h=1 (step S20, NO). The test control circuit 21 then recognizes the presence of isolated bits (step S22). The test control circuit 21 then manages the block as a defective one, and for example, replaces the block on the basis of block redundancy.

As described above, LSI in accordance with the present embodiment makes it possible to search for isolated bits having threshold voltages lower than those included in the population distribution. Thus, effects similar to those of the first embodiment are exerted.

THIRD EMBODIMENT

Now, description will be given of a semiconductor integrated circuit device and a method for testing a semiconductor memory device in accordance with a third embodiment of the present invention. The description of the second embodiment relates to the method for searching for isolated bits for which threshold voltages in the erase state are lower than those included in the population distribution. The present embodiment relates to a method for searching for isolated bits for which threshold voltages in a data write state (the memory cells hold binary 0 data) are lower than those included in the population distribution.

The configuration of LSI 1 in accordance with the present embodiment is as shown in FIG. 16, described in the second embodiment. The search condition is as shown in FIGS. 8 to 10. The verification end voltage is lower than the verification start voltage as is the case with the second embodiment. The other arrangements and operations are similar to those in the second embodiment and will thus not be described below.

Figure 20:
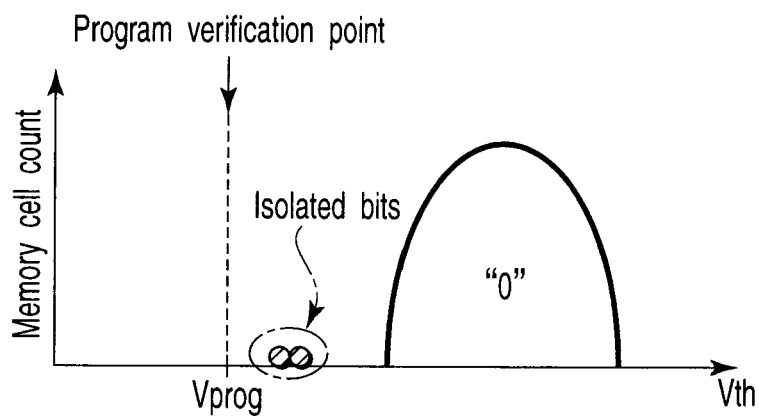
FIG. 20 is a graph showing the threshold distribution of EEPROM.

Now, description will be given of a method for searching for isolated bits which method is executed by the BIST circuit 3 in accordance with the present embodiment. FIG. 20 is a graph showing the threshold distribution of the memory cells MC included in the search target memory block and holding the binary 0 data (data write state), and also showing isolated bits to be searched for in the present embodiment. As shown in FIG. 20, memory cells MC may be present which have threshold levels much lower than those included in the population distribution. These memory cells MC result from a defective manufacturing process or the like and allow data to be written at excessively low speeds. The memory cells MC are not preferable in terms of reliability. The present embodiment thus searches for isolated bits having threshold voltages lower than those included in the population distribution. Vprog in the figure denotes a write verification level. The memory cell MC to which the binary 0 data has been written has the threshold voltage set greater than or equal to Vprog.

FIG. 21 is a flowchart of the method for searching for isolated bits in accordance with the present embodiment, showing the contents the search program 25. The contents of the search program 25 are almost the same as those in the second embodiment.

As shown in FIG. 21, the test control circuit 21 instructs the control circuit 20 for EEPROM 2 to write the binary 0 data to all the memory cells MC in the test target memory block in the memory cell array 10 (step S40). That is, the test control circuit 21 generates such a write data pattern W_DAT as allows binary 0 to be written to all the memory cells MC. The test control circuit 21 then provides the data pattern W_DAT to the data I/O buffer 16. The process subsequently proceeds to step S11, which is executed as is the case with the second embodiment.

As described above, the method in accordance with the present embodiment makes it possible to search even the memory cells MC holding the binary 0 data for isolated bits.

FOURTH EMBODIMENT

Now, description will be given of a semiconductor integrated circuit device and a method for testing a semiconductor memory device in accordance with a fourth embodiment of the present invention. The description of the first embodiment relates to the method for searching for isolated bits for which threshold voltages in the erase state are higher than those included in the population distribution. The present embodiment relates to a method for searching for isolated bits for which threshold voltages in the data write state (the memory cells hold binary 0 data) are higher than those included in the population distribution.

The configuration of LSI 1 in accordance with the present embodiment is as shown in FIG. 1, described in the first embodiment. The search condition is as shown in FIGS. 8 to 10. The verification end voltage is higher than the verification start voltage as is the case with the first embodiment. The other arrangements and operations are similar to those in the first embodiment and will thus not be described below.

Figure 22:
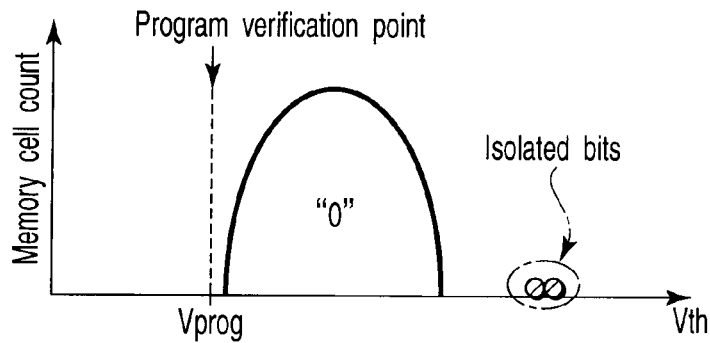
FIG. 22 is a graph showing the threshold distribution of EEPROM.

Now, description will be given of a method for searching for isolated bits which method is executed by the BIST circuit 3 in accordance with the present embodiment. FIG. 22 is a graph showing the threshold distribution of the memory cells MC included in the search target memory block and holding the binary 0 data, and also showing isolated bits to be searched for in the present embodiment. As shown in FIG. 22, memory cells MC may be present which have threshold levels much higher than those included in the population distribution. The present embodiment searches for isolated bits for which threshold voltages in the write state are lower than those included in the population distribution.

Figure 23:
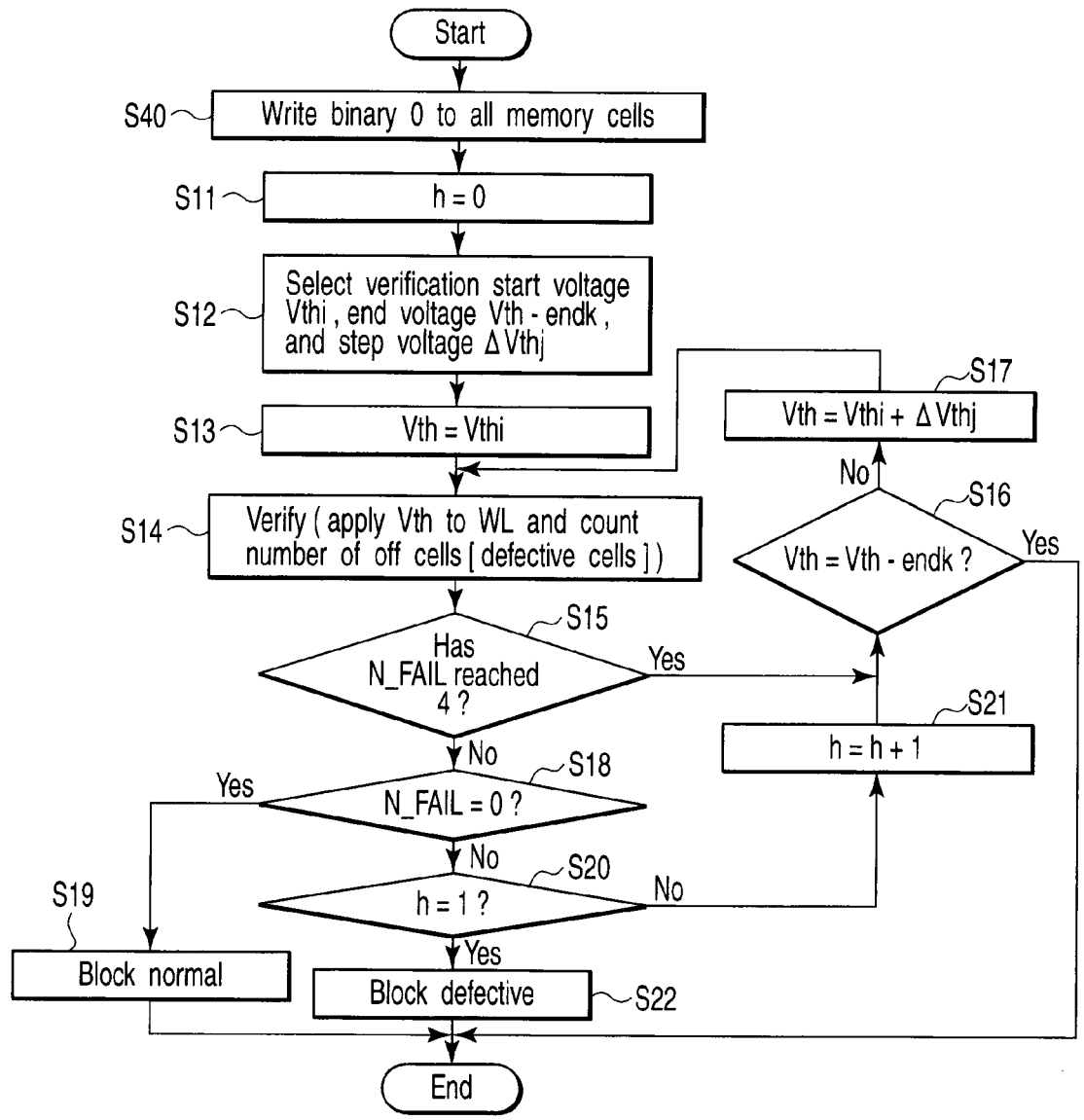
FIG. 23 is a flowchart showing a method for searching for isolated bits in LSI in accordance with a fourth embodiment of the present invention.

FIG. 23 is a flowchart of the method for searching for isolated bits in accordance with the present embodiment, showing the contents the search program 25. The contents of the search program 25 are almost the same as those in the second embodiment.

As shown in FIG. 23, the test control circuit 21 instructs the control circuit 20 for EEPROM 2 to write the binary 0 data to all the memory cells MC in the test target memory block in the memory cell array 10 (step S40). That is, the test control circuit 21 generates such a write data pattern W_DAT as allows binary 0 to be written to all the memory cells MC. The test control circuit 21 then provides the data pattern W_DAT to the data I/O buffer 16. The process subsequently proceeds to step S11, which is executed as is the case with the first embodiment.

As described above, the method in accordance with the present embodiment makes it possible to search even the memory cells MC holding the binary 0 data for isolated bits.

FIFTH EMBODIMENT

Now, description will be given of a semiconductor integrated circuit device and a method for testing a semiconductor memory device in accordance with a fifth embodiment of the present invention. The present embodiment relates to an observation current point during the verification in step S14 in accordance with the first or fourth embodiment description.

Figure 24:
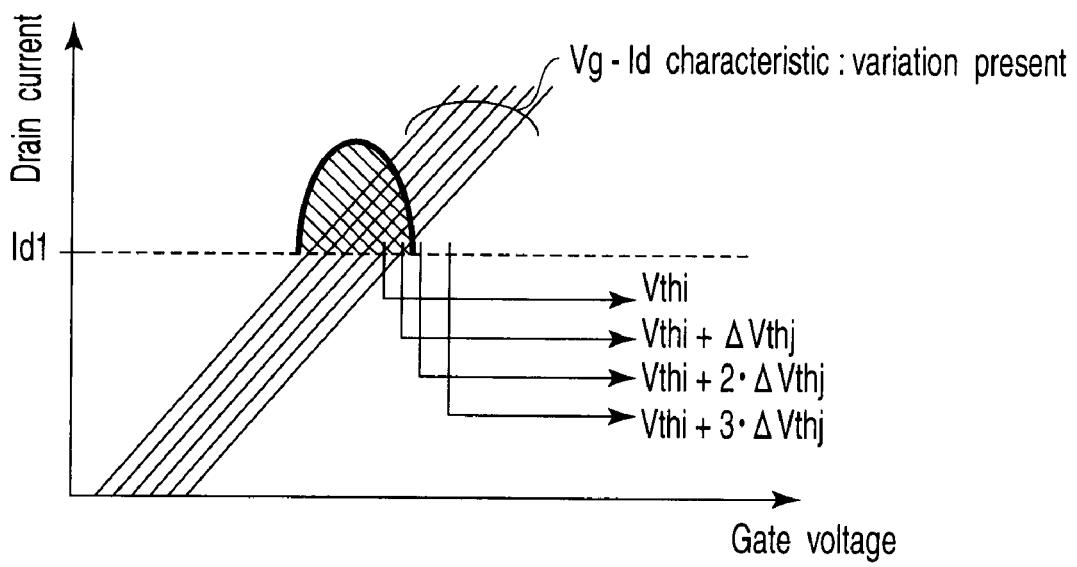
FIG. 24 is a graph showing a drain current relative to a gate voltage in EEPROM in accordance with a fifth embodiment of the present invention.

FIG. 24 is a graph showing the property of a drain current Id relative to a gate voltage Vg for the memory cells MC included in a memory block. As shown in the figure, the drain current Id has the property of increasing almost in proportion to the gate voltage Vg. In step S14, verification is performed using a certain point in the drain current Id as an observation point (hereinafter referred to as Id1). As shown in FIG. 24, during the verification, the voltage of the word line is sequentially varied at the observation point Id1 starting with Vthi. In this case, since the property of the drain current Id varies among the memory cells MC, the threshold voltages of the memory cells MC are distributed over a certain specified range, as shown by the shaded area in the figure. However, when no memory cell MC is defective, the distribution constitutes a population with no isolated bit.

Figure 25:
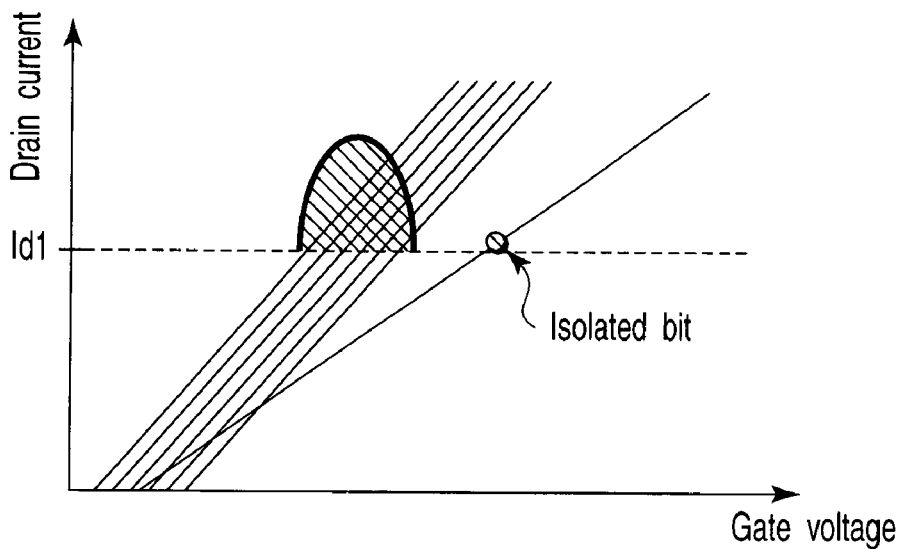
FIGS. 25 and 26 are graphs showing the drain current relative to the gate voltage in EEPROM in accordance with the fifth embodiment of the present invention.

FIG. 25 is a graph showing the relationship between the gate voltage Vg and the drain current Id in which isolated bits are present. As shown in the figure, the property of the drain current Id in the memory cells MC corresponding to isolated bits having greater thresholds than the population exhibits a smaller inclination than that in the normal memory cells MC (included in the population distribution). Consequently, at the observation point Id1, the thresholds of the isolated bits are observed to lie away from the population distribution.

Figure 26:
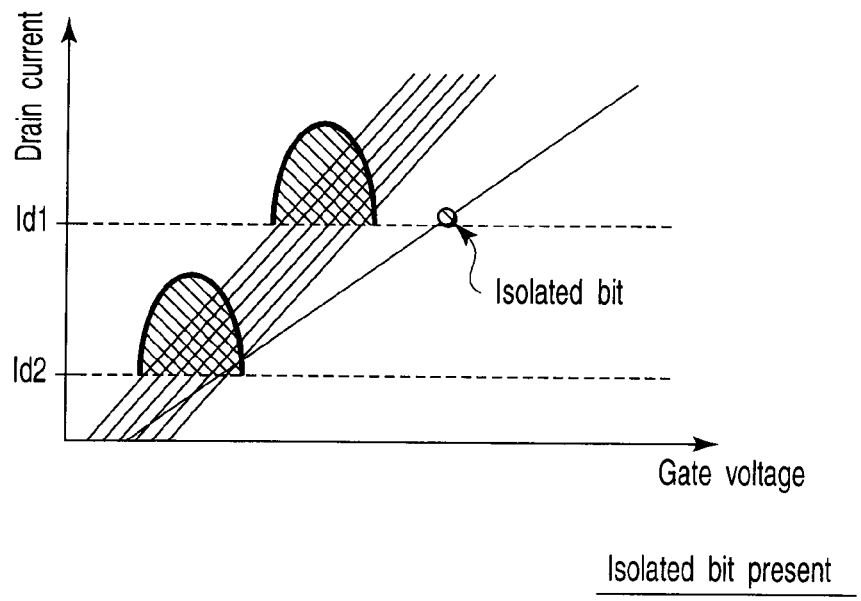

FIG. 26 is a graph similar to that in FIG. 25. As described above, verification at the observation point Id1 allows the threshold voltages of the memory cells MC corresponding to isolated bits to be observed to lie away from the population distribution. However, when the observation point is Id2 corresponding to a lower current than Id1, the threshold voltages of the memory cells MC corresponding to isolated bits are observed to lie inside the population distribution. That is, the memory cells MC that are to be determined to be defective are observed to be normal owing to the small drain current Id corresponding to the observation point.

Thus, in the first and fourth embodiments, the observation point for the drain current Id is desirably set at an appropriate value. More specifically, using a plurality of observation points in step S14 allows isolated bits to be more accurately searched for.

This also applies to the second and third embodiments. If the thresholds of the isolated bits are smaller than those included in the population distribution, the inclination of the drain current Id for the isolated bits is expected to be larger than that of the drain current Id for the memory cells included in the population distribution. Thus, also in this case, a plurality of observation points are desirably used in step S14.

As described above, with the semiconductor integrated circuit device and the method for testing the semiconductor memory device in accordance with any of the first to fifth embodiments of the present invention, the threshold level is varied and the number of memory cells having a threshold voltage higher or lower than the threshold level is measured. If the number of such memory cells is consecutively determined to be smaller than the criterion number for the presence of isolated bits, the presence of isolated bits is determined. More specifically, to search for isolated bits having larger thresholds than the population distribution, the number of memory cells in the off state is measured with the threshold level increased. In contrast, to search for isolated bits having smaller thresholds than the population distribution, the number of memory cells in the on state is measured with the threshold level reduced. This method is implemented by the BIST circuit 3, provided in LSI 1. This makes it possible to accurately search for isolated bits while reducing the time required for the search.

Figure 27:
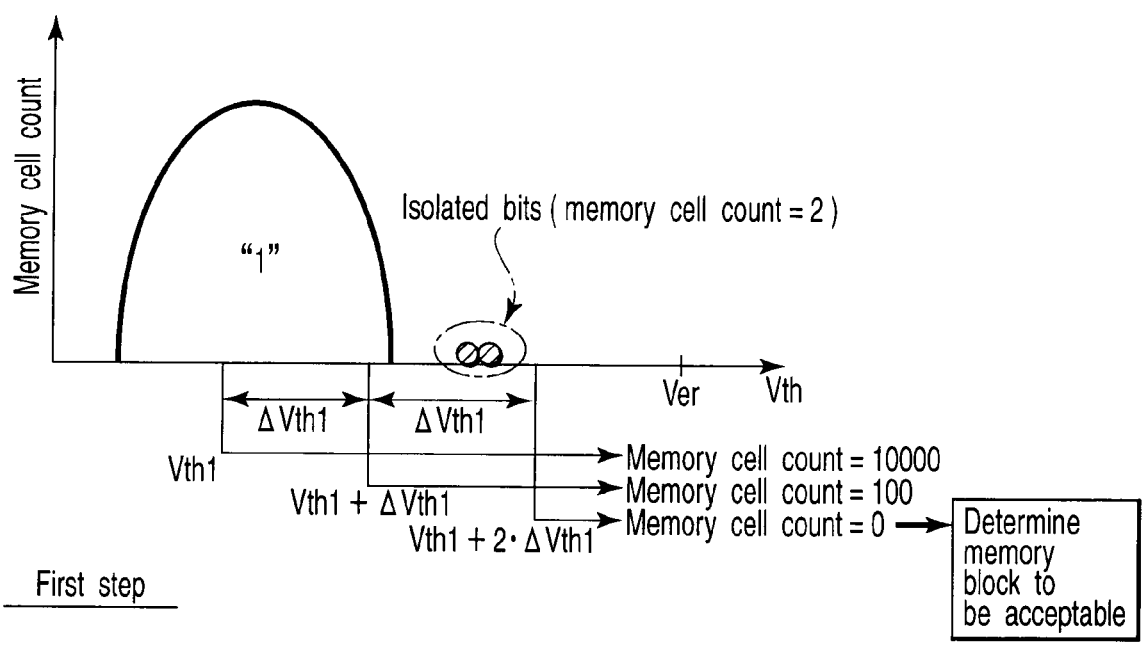
FIGS. 27 and 28 are graphs showing the threshold distribution of a memory block provided in EEPROM in accordance with a variation of the first to fifth embodiments of the present invention, and also showing a method for searching for isolated bits.
Figure 28:
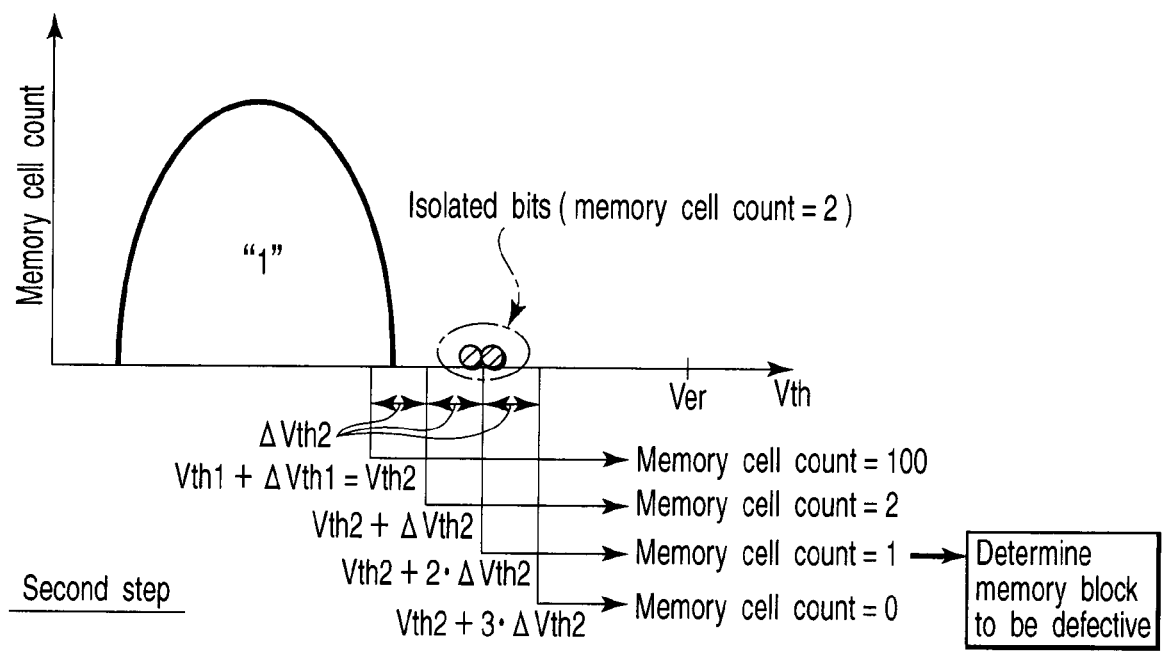

In the above-described embodiments, isolated bits may be searched for by executing the search program 25 a number of times. The present method will be described with reference to FIGS. 27 and 28. FIGS. 27 and 28 are graphs showing the threshold distribution of the memory cells MC included in a certain memory block.

First, as shown in FIG. 27, it is assumed that two isolated bits are present and that a search is performed using the verification start voltage Vth1 and the step voltage $\Delta$Vth1. It is further assumed that 10,000 cells are turned off at the threshold level Vth1, 100 cells are turned off at the threshold level (Vth1+$\Delta$Vth1), and no cell is turned off at the threshold level (Vth1+2·$\Delta$Vth1). Then, in spite of the presence of the isolated bits, the memory block is determined to be acceptable. This is due to the excessively high step voltage $\Delta$Vth1.

Thus, in this case, two searches are performed, as shown in FIG. 28. That is, the search in FIG. 27 indicates that the base of the population distribution lies between (Vth1+$\Delta$Vth1) and (VTh1+2·$\Delta$Vth1). The second search is thus performed within this range. That is, the search is performed with the verification start voltage set equal to Vth2=(Vth1+$\Delta$Vth1) to set the step voltage equal to A$\Delta$Vth2 (<$\Delta$VTh1). Then, two cells are turned off at the threshold level (Vth2+$\Delta$Vth2). One cell is turned off at the threshold level (Vth2+2·$\Delta$Vth2). This enables the isolated bits to be found, allowing the memory block to be determined to be defective.

Alternatively, the threshold level may be reduced during a search for isolated bits having larger thresholds than the population distribution. The threshold level may be increased during a search for isolated bits having smaller thresholds than the population distribution. However, the methods described in the above embodiments are desirably used in order to reduce the time required for the search.

Furthermore, in the above description of the embodiments, the verification in step S14 is performed on each memory block. However, this is only an example for block redundancy, and if replacement is performed on each column, the verification in step S14 may be performed on each column. The above description of the embodiments relates to the NOR flash memory. However, the present embodiments are widely applicable to nonvolatile semiconductor memories in general, for example, NAND flash memories.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a semiconductor memory which includes a memory block having a plurality of memory cells and which tests the memory cells during a test operation to determine whether or not the memory cells are acceptable; and
   a test circuit which controls the test operation on the semiconductor memory, the test circuit including
   a controller which consecutively increments a gate voltage of the memory cells and which controls the semiconductor memory so as to read a data from the memory cells provided with the gate voltage on each memory block; and
   a counter which measures, for the gate voltage which is incremented by the controller, the number of memory cells determined to be defective depending to the result of reading the data, the controller determining the memory block to be defective when the counter consecutively shows a count falling within a predetermined range during the variation in gate voltage.

2. The device according to claim 1, wherein if at least n (n is a natural number greater than or equal to 1) memory cells have a threshold voltage deviating from a main distribution, the controller determines the memory block to be defective, the counter is configured to count at least (n+1) bits, and if the counter consecutively shows a count of at least 1 and at most n, the controller determines the memory block to be defective.

3. The device according to claim 1, wherein the test circuit further includes a storage section which holds information on an upper limit and a lower limit on the gate voltage and the width of the incrementation of the gate voltage, and the controller controls the gate voltage in accordance with the information read from the storage section.

4. The device according to claim 1, wherein each of the memory cells have a MOS transistor including a charge storage layer and a control gate formed on the charge storage layer with an inter-gate insulating film interposed therebetween.

5. A semiconductor integrated circuit device comprising:

a semiconductor memory which includes a memory block having a plurality of memory cells and which tests the memory cells during a test operation to determine whether or not the memory cells are acceptable; and a test circuit which controls the test operation on the semiconductor memory, the test circuit including a controller which consecutively decrements a gate voltage of the memory cells and which controls the semiconductor memory so as to read a data from the memory cells provided with the gate voltage on each memory block; and a counter which measures, for the gate voltage which is incremented by the controller, the number of memory cells determined to be normal depending to the result of reading the data, the controller determining the memory block to be defective when the counter consecutively shows a count falling within a predetermined range during the variation in gate voltage.

6. The device according to claim 5, wherein if at least n (n is a natural number greater than or equal to 1) memory cells have a threshold voltage deviating from a main distribution, the controller determines the memory block to be defective, the counter is configured to count at least (n+1) bits, and if the counter consecutively shows a count of at least 1 and at most n, the controller determines the memory block to be defective.

7. The device according to claim 5, wherein the test circuit further includes a storage section which holds information on an upper limit and a lower limit on the gate voltage and the width of the decrementation of the gate voltage, and the controller controls the gate voltage in accordance with the information read from the storage section.

8. The device according to claim 5, wherein each of the memory cells have a MOS transistor including a charge storage layer and a control gate formed on the charge storage layer with an inter-gate insulating film interposed therebetween.

9. A method for testing a semiconductor memory device including a memory block having a plurality of nonvolatile memory cells, the method comprising:

performing a data erasing or writing operation on all the memory cells in the memory block at a time;

setting a first threshold voltage and a voltage variation width;

in the memory block, varying a value in increments or decrements of the voltage variation width from the first threshold voltage and counting the number of memory cells having a threshold voltage exceeding the value using a counter configured to count (n+1) bits (n is a natural number greater than or equal to 1); and determining the memory block to be defective when the counter consecutively shows a count of at least 1 and at most n during the variation in the value.

10. The method according to claim 9, wherein the value is varied by the voltage variation width and the counter repeats counting the number of memory cell, when the number of the memory cells reaches (n+1) in the counter.

11. The method according to claim 9, wherein the varying and counting includes incrementing a voltage applied to a gate of the memory cells by the voltage variation width;

sequentially reading data from the memory cells with the voltage applied to the gate; and on the basis of the read data, counting the number of memory cells in an off state.

12. The method according to claim 11, wherein when the number of memory cells in the off state reaches (n+1), the reading of the data is ended.

13. The method according to claim 9, wherein the varying and counting includes decrementing a voltage applied to a gate of the memory cells by the voltage variation width;

sequentially reading data from the memory cells with the voltage applied to the gate; and on the basis of the read data, counting the number of memory cells in an on state.

14. The method according to claim 13, wherein when the number of memory cells in the on state reaches (n+1), the reading of the data is ended.

15. The method according to claim 9, wherein each of the memory cells have a MOS transistor including a charge storage layer and a control gate formed on the charge storage layer with an inter-gate insulating film interposed therebetween.

* * * * *